(12) United States Patent
Vora

(10) Patent No.: US 9,476,991 B2
(45) Date of Patent: Oct. 25, 2016

(54) 3D HIGH RESOLUTION X-RAY SENSOR WITH INTEGRATED SCINTILLATOR GRID

(71) Applicant: Terapede Systems Inc., Campbell, CA (US)

(72) Inventor: Madhukar B. Vora, Los Gatos, CA (US)

(73) Assignee: TERAPEDE SYSTEMS INC., Campbell, CA (US)

( * ) Notice: Subject to any disclaimer, the term of this patent is extended or adjusted under 35 U.S.C. 154(b) by 0 days.

(21) Appl. No.: 14/508,919

(22) Filed: Oct. 7, 2014

(65) Prior Publication Data

US 2016/0097864 A1  Apr. 7, 2016

(51) Int. Cl.
*H01L 29/49* (2006.01)
*G01T 1/20* (2006.01)
*G01T 1/24* (2006.01)
*H01L 27/146* (2006.01)

(52) U.S. Cl.
CPC ............... *G01T 1/2018* (2013.01); *G01T 1/24* (2013.01); *H01L 27/1469* (2013.01); *H01L 27/14609* (2013.01); *H01L 27/14661* (2013.01); *H01L 27/14663* (2013.01); *H01L 27/14687* (2013.01)

(58) Field of Classification Search
CPC .................. H01L 27/14609; H01L 27/14632; H01L 27/14634; H01L 27/14663; H01L 27/1469
See application file for complete search history.

(56) References Cited

U.S. PATENT DOCUMENTS

2004/0251420 A1\* 12/2004  Sun ........................ G01T 1/2018
250/370.09

\* cited by examiner

*Primary Examiner* — Michael Shingleton
(74) *Attorney, Agent, or Firm* — David R. Stevens; Stevens Law Group

(57) ABSTRACT

Various embodiments of a 3D high resolution X-ray sensor are described. In one aspect, an indirect X-ray sensor includes a silicon wafer that includes an array of photodiodes thereon with each of the photodiodes having a contact on a front side of the silicon wafer and self-aligned with a respective grid hole of an array of grid holes that are on a back side of the silicon wafer. Each of the grid holes is filled with a scintillator configured to convert beams of X-ray into light. The indirect X-ray sensor also includes one or more silicon dies with an array of photo-sensing circuits each of which including a contact at a top surface of the one or more silicon dies. Contact on each of the photodiodes is aligned and bonded to contact of a respective photo-sensing circuit of the array of photo-sensing circuits of the one or more silicon dies.

10 Claims, 28 Drawing Sheets

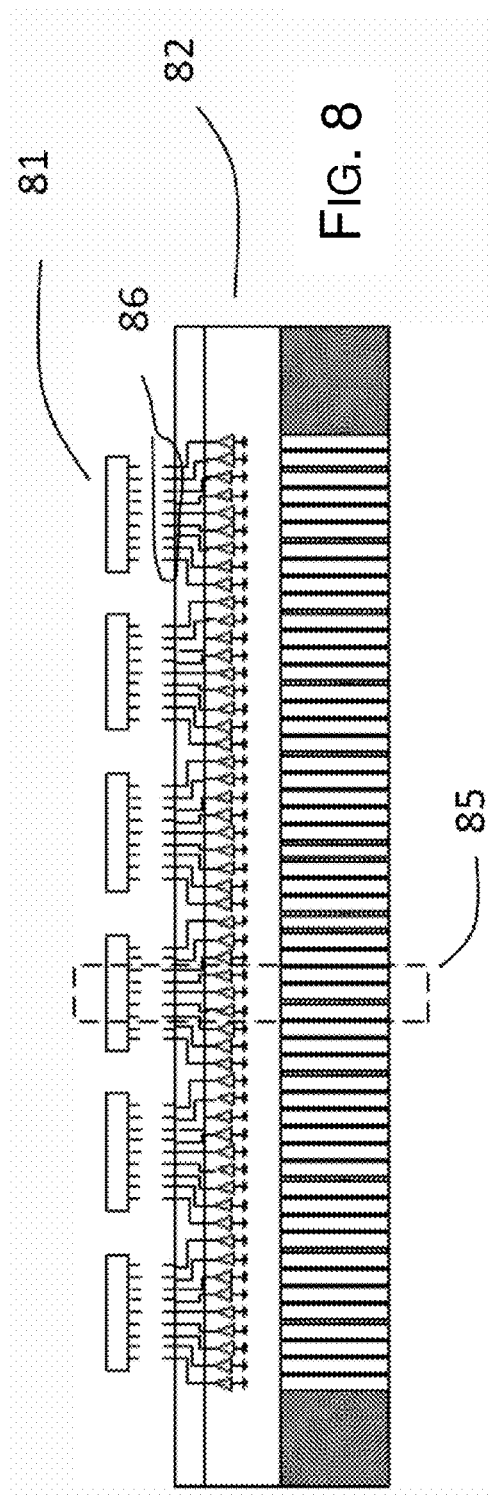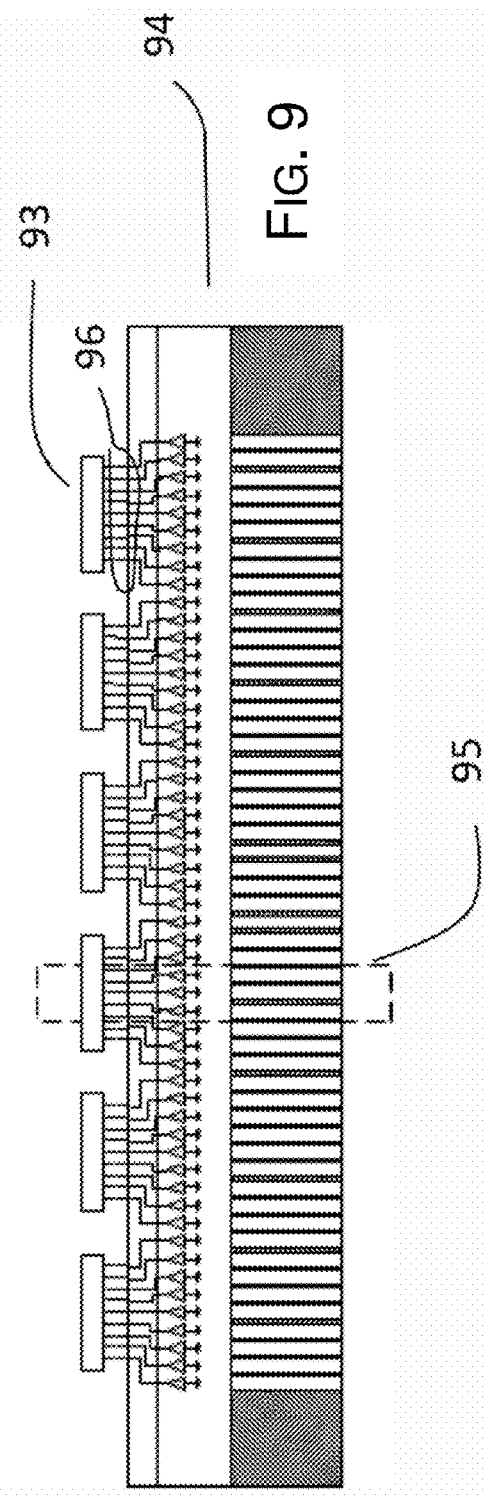

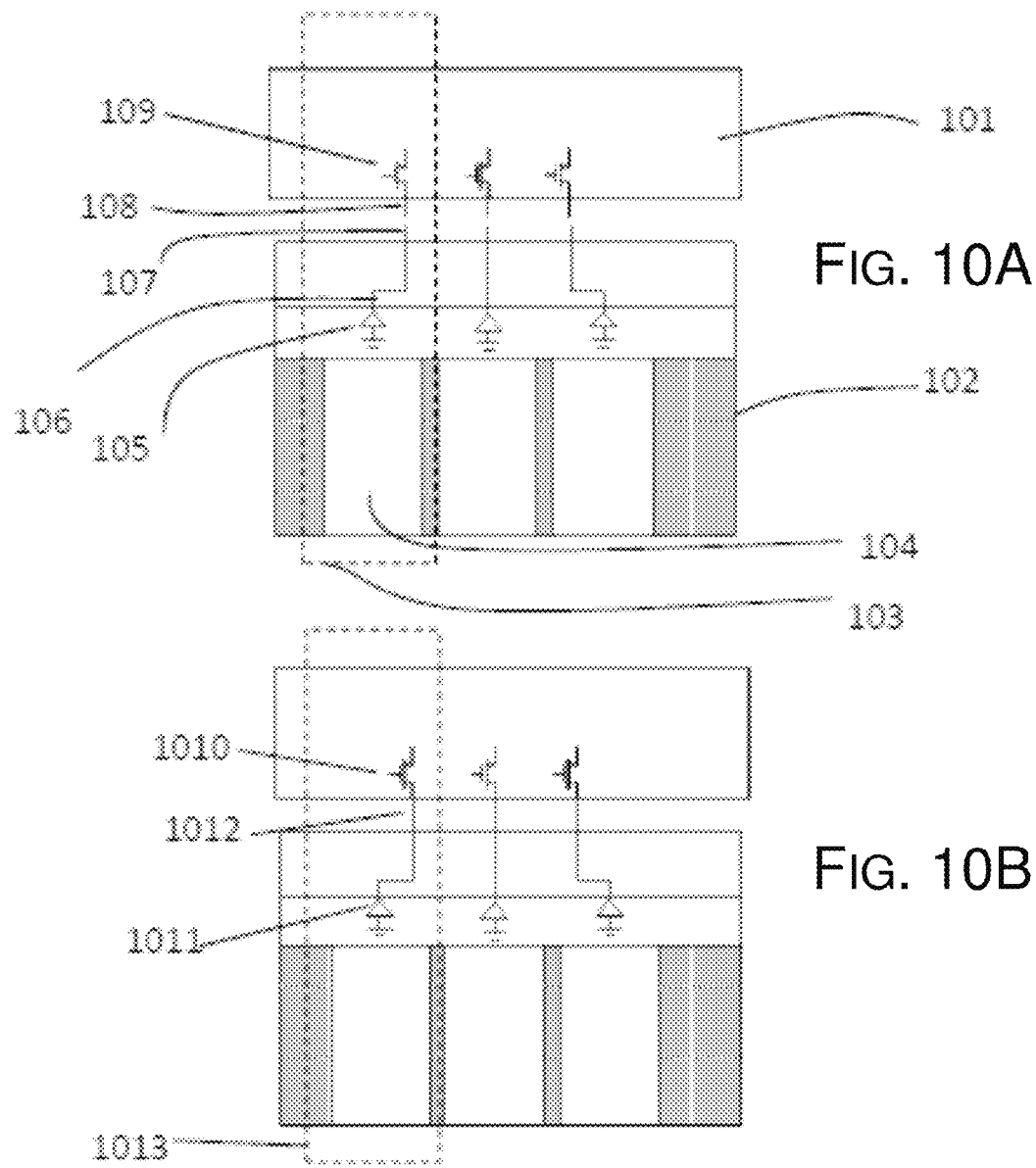

3D HIGH RESOLUTION X-RAY SENSOR WITH INTEGRATED SCINTILLATOR GRID

RELATED APPLICATIONS

This application is related to U.S. application Ser. No. 14/508,930, filed Oct. 7, 2014, U.S. application Ser. No. 14/508,947, filed Oct. 7, 2014, U.S. application Ser. No. 14/508,959, filed Oct. 7, 2014, U.S. application Ser. No. 14/508,965, filed Oct. 7, 2014, and U.S. application Ser. No. 14/508,969, filed Oct. 7, 2014, All applications are incorporated herein by reference for all purposes.

TECHNICAL FIELD

The present disclosure relates to X-ray sensors and, more particularly, to a three-dimensional (3D) high resolution X-ray sensor with integrated scintillator.

BACKGROUND

Solid-state digital X-ray detectors, also referred to as X-ray sensors, can be constructed by employing either of two physical detection methods, so-called direct and indirect conversion methods. Generally, a direct conversion method makes use of direct production of electrons by X-rays in elemental compounds such as amorphous silicon or selenium, lead oxide, lead iodide, thallium bromide, or various gadolinium compounds. In this case, the electrons are collected via electric fields and electrodes attached to thin film transistors. On the other hand, an indirect conversion method employs conversion of X-ray interactions to flashes of light in well-known scintillating materials such as thallium-activated cesium iodide or gadolinium oxysulfate. In this case, the light flashes are sensed by photodiodes, and the resulting electron currents are again collected by attached transistor electronics.

The collecting electrodes or photodiodes are configured as a pixel field embedded in a large flat panel configuration, and images are formed in a manner similar to conventional digital cameras and video displays through electronic processing of the collected charges. Once formed, these images can be displayed on video monitors, printed on film or paper, or placed in an electronic storage system for later retrieval.

Both direct and indirect detectors are typically made of thin-film-transistor (TFT) arrays for pixel processing and readout. These TFT arrays offer a variety of advantages over traditional X-ray imaging systems. Compared to conventional screen film systems, a film-less system can be achieved, facilitating improved image quality based on digital image processing, diagnostic support, electronic filing, and networking. However, limitations of TFT arrays include resolution, contrast and noise. These three parameters describe the image. There are three other intermediate parameters that tie in these three parameters, including spatial frequency, modular transfer function (MTF) and signal-to-noise (S/N) ratio. The spatial frequency or spatial resolution of an imaging system can be defined in terms of smallest spacing between two objects that can be imaged clearly. It is measured in terms of line pairs per millimeter or lp/mm. The MTF describes the contrast produced by an imaging system as a function of spatial frequency of an object. Another concept in determining the quality of imaging system is detective quantum efficiency (DQE). DQE is the ratio of S/N at the source to S/N at the signal output. DQE influences the X-ray dose required to create a good quality image.

S/N ratio, MTF and DQE are used to determine how good an X-ray detector is in converting X-rays through objects into a good quality image. S/N and MTF are very dependent of two structural parameters of X-ray detector, namely: pixel pitch and noise generated by the sensor due to interaction of X-ray with sensor material and electronic noise generated by electronics.

FIG. 1 shows a typical indirect TFT X-ray imaging detector that has a layer of scintillator 13 to convert X-ray 11 into light that is placed on the top of an active pixel array circuit 16 made in an amorphous silicon substrate 14. The active pixel 15, 17 has a photodiode 18 to detect light and transistor(s) 19 to amplify the signal from the photodiode. Sometimes three or more transistors and a diode are used in an active pixel to reduce the noise. Detected light is converted in to electrical signal by the photodiode 18. Signals from the photodiodes are sensed by a transistor 19. Select lines 111 and sense lines 110 are connected to the transistor to bring out the sensed analog signal to the edge of the detector die. Then the analog signals are converted to digital signals, amplified and encoded and streamed out to perform next level of signal processing to create an image 115 of the sensed object 12 displayed in monitor 114 by connecting sensor substrate 14 to computer 113 through wire 112.

The resolution of an X-ray detector is limited by either size of the active pixel or scintillator resolution, whichever is lower. Pixel dependent resolution can be calculate by 2× width of the active pixel. Scintillator resolution determined by the scattering light which in turn depends on thickness of the scintillator. Resolution or lp/mm (line pair per millimeter) at a fixed MTF can be calculated by 2× thickness of the scintillator approximately. For example, if active pixels pitch is 200 microns, then active pixel limited of resolution will be 2.5 lp/mm and if scintillator thickness is 500 micron then scintillator limited resolution will be 1.0 lp/mm. Thus, the overall resolution of modern indirect TFT detector will be about 1.0 lp/mm in this example. Resolution is defined here as lp/mm at a fixed MTF.

A typical direct TFT X-ray detector has a layer of photoconductor on the top of an active pixel array. The active pixel has an electrode, a capacitor and transistors. Since photoconductor has significantly less scattering of electrons, the resolution of direct TFT is limited by the active pixel pitch which is about 100 to 200 microns, and should be 5.0 lp/mm at MTF of 50%. However, due to the noise in amorphous silicon and electronic noise, best resolution observed is less than 2 lp/mm.

The active pixel area in a TFT detector is occupied by a photodiode or an electrode with capacitor and transistors. The transistors in pixel occupy most of the pixel area because they are very large due to very low mobility of the amorphous silicon. Thus, the ratio of photodiode or electrode area and the total area of the pixel termed as fill factor determine what percentage of X-rays has been sensed. Both direct and indirect detectors have fill factor of less than 30%. Fill factor influences the dose required to create a clear image in a detector.

Recently TFT is being replaced by single crystal silicon based detectors to overcome the above limitations of TFT detectors. Those limitations are resolution and fill factor. These silicon based detectors have lower noise, higher dynamic range, smaller pixel capability and higher fill factor. Hence they have potential for high resolution, high DQE, and higher readout speeds. Silicon based detectors are designed for indirect conversion of X-rays into electron. The reason is that the silicon based detectors are driven by CMOS based optical camera technology. Thus theoretically, very high resolution is possible with silicon based detectors. Pixel pitches of as low as 2 microns are being manufactured by digital camera companies. High resolution and DQE of 70% was obtained. This was due to less than 100 micron active pixels with high fill factor, low noise and high dynamic range.

However, there are still several limitation in improving X-ray detector physical size, image quality and dose requirements even with current with silicon based detectors technology. These limitations are described below.

Size of a silicon detector panels is a big limitation today. Size of a TFT panels today is about 100 cm×100 cm which is needed for most medical applications. Largest silicon panel today is 20 cm×25 cm made with 4 or 6 dies tiled together. This tiling causes missing pixel rows and columns which affects quality of image. It is not possible to increase the silicon panel size due to two reasons.

First is the size of the die and second is the number of the tiles that can be tiled together. Size of the die is limited by the yield of dies on wafer due to defects.

Since pixels and select and sense circuits are on the same die, the die can be tiled only on three sides. The fourth side is used for select and sense circuits.

The smaller the pixel, the higher the resolution will be. Best pixel size in silicon large X-ray detector is about 100 microns giving a resolution of 5 lp/mm. This resolution corresponds to an object of the size of about 1 millimeter clearly in an image. To see anything smaller one would need higher resolution. However, any reduction in pixel size but still for a given die size results in lower yield of the die.

Die size is limited by number of transistors on a die. As an example, following table shows yield of a large die as a function active pixel size and size of detector panel for a given defect density. Largest size of die possible with 300 cm diameter silicon wafer is 20 cm×20 cm. Lithography assumed is 180 nm. Area of a typical transistor is 4 micron$^2$. Yield is calculated using industry standard method.

| Pixel size (in microns) | 100 | 100 | 100 | 50 | 20 | 6 |
|---|---|---|---|---|---|---|
| Die size (in cm on side) | 5 | 10 | 20 | 20 | 20 | 20 |
| No. of pixels on the die (in millions) | 0.25 | 1.00 | 4.00 | 16 | 100 | 1000 |
| No. of transistor per die (millions) (3 transistor/pixel) | 0.75 | 3.00 | 12.00 | 48 | 300 | 3000 |
| Die Yields (for 1 defect/cm$^2$) | 97% | 89% | 62% | 15% | 0% | 0% |

Yield decreases as the die size increases and pixel size decreases. Loss of yield translates into cost of the detector die. It is not economical to build a large die that is 20 cm×20 cm with pixels size below 100 microns. In addition one could improve the image quality if more than three transistors can be used per pixel. It has been demonstrated that by adding functions such as A/D and memory, one can increase speed or frame rate significantly to make video images. These added functions will require adding more transistors per pixel. One of the limitations of the silicon die is that yield loss is exponential as one increases the number of transistor per pixel as shown in the table below.

| No. of transistor per die | 3 | 6 | 12 | 24 |
|---|---|---|---|---|
| Pixel size (in microns) | 100 | 100 | 100 | 100 |
| Die size (in cm on side) | 20 | 20 | 20 | 20 |
| No. of transistor per die | 3 | 6 | 12 | 24 |
| No. of pixels on the die (millions) | 4 | 4 | 4 | 4 |
| Die Yields (for 1 defect/cm$^2$) | 62% | 38% | 15% | 2% |

Thus, even with 100 micron pixel size the die yield will drop quickly if transistors per pixel are increased beyond three transistors.

Best resolution today on silicon detector is about 5 lp/mm on 8 cm×15 cm die with pixel size of 100 microns. If yield problem can be solved resolution can go to more than 80 lp/mm.

The speed at which digitized image data can be obtained becomes very important parameter when the amount of data per frame increase exponentially due to reduction of size of pixel. A one-megapixel silicon detector with a pixel size of 200 microns generates 14 Mb of data that has to be extracted in one exposure time of one second or at the rate of 14 Mb/sec. A large silicon detector with small pixel may require 10 times to 100 times the data rate required in one megapixel detector. Data extraction from the die at those rates is not possible today due to the number of transistors available per pixel.

Electronic noise is an important component of the S/N (signal to noise ratio) at the output of the detector die. Amplified analog signals from photodiode in each pixel are carried to the edge of the detector die through set of sense lines. Cross talk on these sense lines is a source of noise that affects S/N at the output.

Most scintillators are films of materials that convert X-ray into light. The main limitation of these scintillator film are the amount of light spreading generated from each X-Ray photon sideways into neighboring pixel. The amount of light spreading limits the resolution of the film. Thus, even if silicon detector has high resolution, it may be limited by the scintillator. Typical films are 300 to 500 microns. Limiting resolution to 1.0 lp/mm. One could increase resolution by thinning the thickness of the scintillator to 100 microns but that means all the X-rays are not absorbed by the scintillator. Hence it will take more X-rays to get the same quality of image or higher dose. Unabsorbed X-rays will damage the electronics or the objected that is being exposed. To prevent these unabsorbed X-rays a fiber optic plate is place to absorb the X-rays as well as collimate the light it improve the resolution. Resolution has been improved to 5 lp/mm. Key problems with fiber optic plate are X-rays passing through space between fibers affecting quantum efficiency as well affecting electronics and object being X-rayed.

A grid structure as in FIG. 2 is used to reduce the spread of light. FIG. 2 shows a typical layout of a grid on a silicon die with active pixel containing photodiode. A grid is placed on the silicon die 21 with active pixels 23. The grid holes 22 are aligned to active pixel 23. The section AA' in FIG. 2 is shown in FIG. 3. Grid 31 with holes 35 filled with scintillator material 32 such as CsI is placed on a substrate 33 with active pixels 34. In one approach, a grid is made with Tungsten substrate and filled with scintillator material. Grid holes act like optical waveguide limiting spreading of light to adjacent pixel. More recently, in another approach, silicon grids as that shown in FIG. 4 are used to create optical waveguide to limit light scattering to adjacent pixel. The silicon substrate 44 with active pixels 46 are placed below grid 41 with holes 43 filled with CsI. The oxide 42 in the sidewalls of hole makes light generated in the CsI to confine in the hole by total internal reflection. Limitation of grid scintillator has been the inability of precisely aligning grid holes to the photodiode as in FIG. 4. When grid 41 is placed on silicon die 44, pixel 46 is misaligned to the grid hole 43. Misalignment 45 causes significant crosstalk in adjacent pixels leading to noise. Difficulty in aligning is due to inability to see alignment marks on the silicon die clearly through the grid holes filled with scintillator material. This problem becomes more acute as pixel sizes are reduced to increase resolution. Presently this problem limits pixel size to about 100 microns.

Another type of silicon detector has also been developed in industry by integrating silicon dies in three dimensions (3D) or by stacking dies and connecting them with vertical connectors. In one 3D scheme photodiode array can be placed in a very large die (photodiode die) whose size is limited by the biggest silicon wafer available. Another die (CMOS die) of same size is designed with pixel addressing CMOS circuits. There are three limitations in this scheme as described below.

First, size of pixels is limited by the accuracy with which CMOS die can be aligned with photodiode die. Alignment limits the size of pixel to about 40 microns. Second, yield of the large CMOS die becomes very low as its size increase for the same reasons as discussed above in the case of active pixels. Third, scintillator limits the resolution as described in active pixel case previously.

A direct detector may also be utilized for imaging applications. The detector is constructed by placing CdTe die with Schottky diodes on the CMOS die. Operation of this direct detector is very similar to indirect 3D detector described earlier. There are, however, limitations to this type of detectors, as described below.

First, size of pixels is limited by the accuracy with which CMOS die can be aligned with photodiode die. Alignment limits the size of pixel to about 40 microns. Moreover, yield of the large CMOS die becomes very low as its size increase for the same reasons as discussed above in the case of active pixels.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

FIG. 8 shows schematic cross sectional view of sense-dies placed just above the photo-die and self-aligned to the contact array in the photo block.

FIG. 9 shows schematic cross sectional view of a portion of the sense-die in contact with a portion of the photo-die after bonding.

FIG. 10A is an enlarged view of the section of 3D pixels in FIG. 8 after alignment.

FIG. 10B is an enlarged view of the photo pixel part of the 3D pixels in FIG. 9 after bonding.

Figure 1:
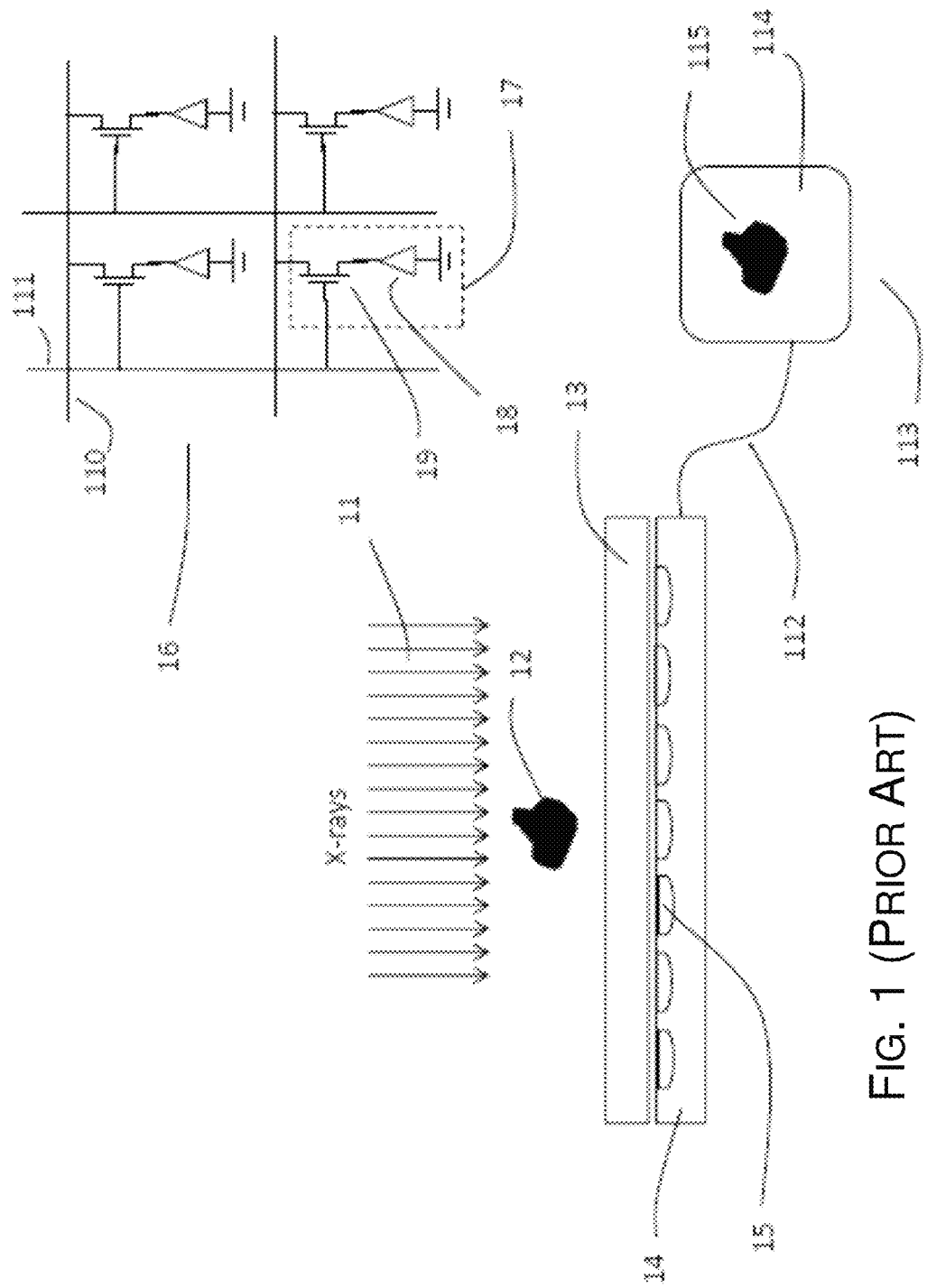
FIG. 1 is prior art describing the existing solid state Indirect X-ray sensor (detector) made with Thin Film Technology or CMOS technology.
Figure 2:
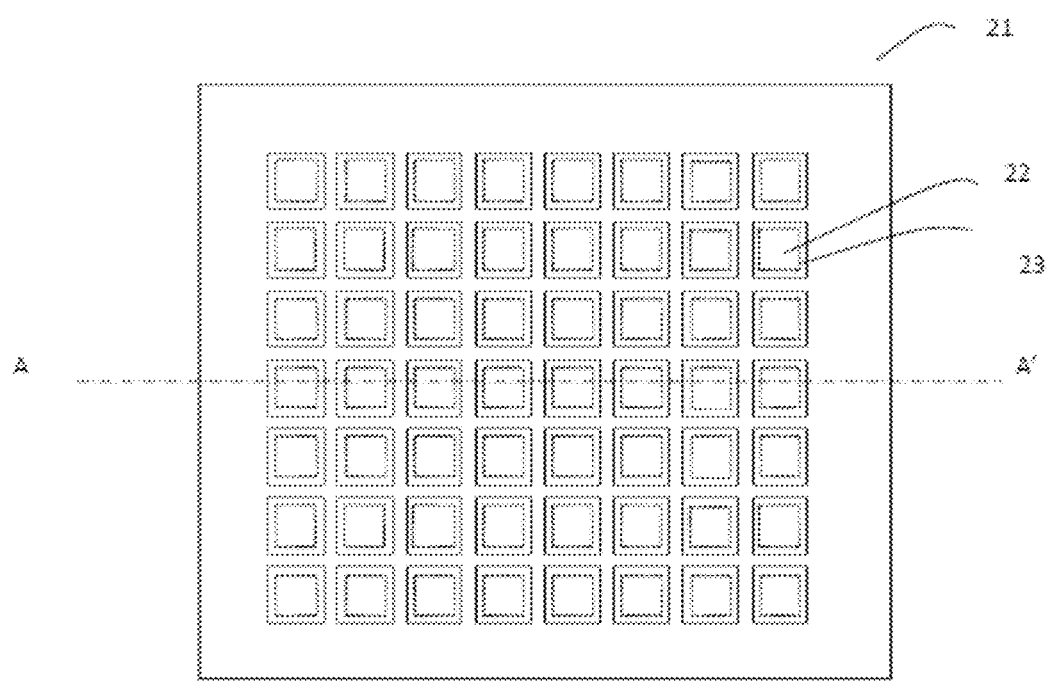
FIG. 2 is a top view of X-ray sensor showing array of active pixels in prior art.
Figure 3:
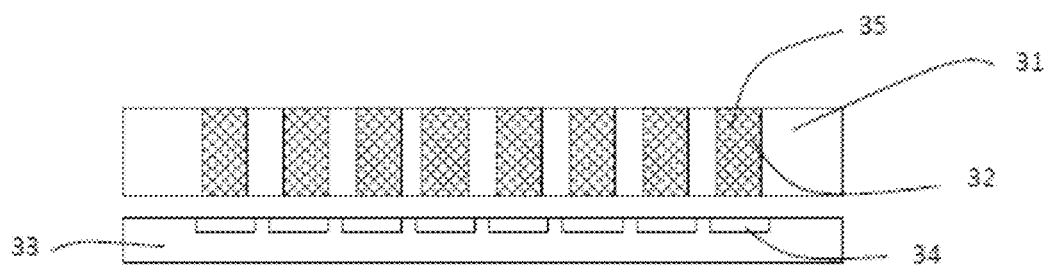
FIG. 3 is a sectional view of X-ray sensor made with an array of active pixels and a grid scintillator.
Figure 4:
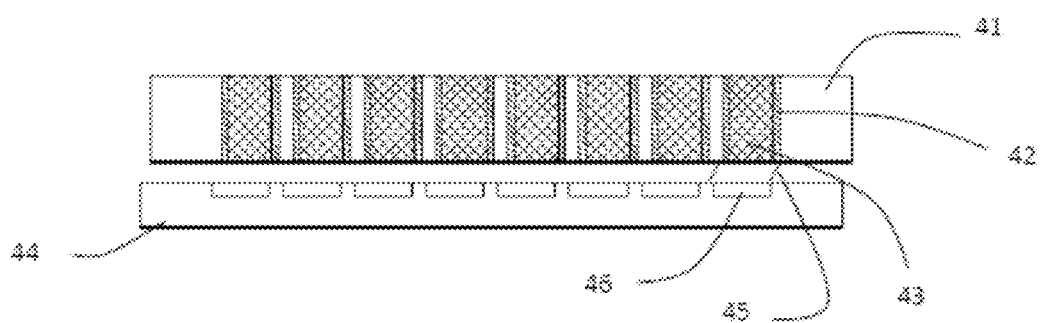
FIG. 4 is a sectional view of an optical waveguide made is silicon.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

DETAILED DESCRIPTION

Overview

The present disclosure solves the problem of building a large area X-ray detector with very high resolution and contrast. In one embodiment, the present disclosure provides construction of an X-ray detector with three dimensional (3D) pixel arrays. This detector has continuous array of 3D pixels with equal spacing and no breaks to cause discontinuity in the image due to missing pixel rows and columns. Continuous pixel array gives continuous image. Each 3D pixel has two components; photo-pixel and sense-pixel.

Photo-pixel is an optical waveguide self-aligned to a photodiode on one silicon substrate or a photo-die. The optical waveguide is a small hole in silicon with a self-aligned photodiode in the bottom and filled with scintillator material. Scintillator material is separated from the silicon walls by either a thin material with a refractive index different from that of silicon or a reflective material. Photo-pixel converts X-rays into light photons and confines the light photons in the hole by total internal reflection. The light photons are then converted into electron-hole pairs by photodiode. These electron-hole pairs charge or discharge the photodiode terminals.

Sense-pixel is the sense circuit on a second silicon substrate or a sense-die. Purpose of the sense circuit is to sense the charge level on the photodiode and convert the charge into an analog or digital signal. Sense-die is placed on the photo-die face down and aligned very precisely. Thus the contact to the one node of the photodiode in the photo-pixel is exactly below the contact to sense circuit in the sense-pixel. Once aligned, photo-pixel and sense-pixel are bonded to each other to form a 3D pixel. Once the sense-die and photo-die are bonded, 3D pixel array construction is complete.

As mentioned earlier photo-pixel array is fabricated on a photo-die. Size of the photo-die may be the largest square or rectangle that can be formed on a wafer. On a 300 mm wafer photo-die may be 20 cm×20 cm. Yields of the photodiode wafers are very high since photodiodes are very insensitive to defects compared to transistors. Sense-pixel array is made on a sense-die which is yield limited. Yield of sense-die depends on the number of the transistors on the sense-die. Thus the size of the sense-die needs to be such that yield is higher than 90% from the economical point of view. Depending on the pixel size, die size may be 1 cm×1 cm to 2 cm×2 cm due to yield limitation. The present disclosure provides the method of constructing 3D X-ray detector by placing, aligning precisely, testing and bonding a large number of pre-tested small sense-dies on one large photo-die.

When multiple sense-dies are placed on the photo-die, each sense-die will address a block of photodiode or photo-block on the photo-die. Total number of the photo-blocks is the same as the number of the sense-die placed on the photo-die. The sense-die includes sense-pixel array as well as pixel addressing circuits at the edges of the sense-die. Hence the contacts in the photo-block under pixel addressing circuits cannot be vertically placed under corresponding contacts on the sense-die. The present disclosure provides a method of connecting photodiode contacts to sense-pixel contacts in a sense-die. The photo-block contact array is shrunk to match the size of the sense-pixel contact array by laterally moving photo-pixel contacts towards the center of the 3D pixel array using multilevel metal interconnect on the photo-die. The photo-block contact array is further shrunk to create adequate space between adjacent sense-dies. This spacing between sense-dies serves two purposes. Firstly, enough room is created for placing and aligning sense-dies on the photo-die. Secondly, metal lines are placed between sense-dies to interconnect sense-dies for power, ground and signals. Signal lines from sense-die are brought out to the edge to the photo-die to be wired to external circuits.

The size of photo-die or the area of the X-ray detector is limited by the size of the wafer. Large area detectors are desirable for medical, industrial and security applications. Presently it is done by tiling multiple X-ray detectors; however, there are two limitations to tiling at the present time. The first limitation is that one of the edges has addressing circuits. Accordingly that side is not available, leaving only three sided tiling. This limits width of the X-ray detector. The second limitation is the spacing between the detector tiles affecting the resolution of X-ray detector. Presently spacing between two tiles needs to be kept above 200 microns. That limits X-ray resolution to less than 1.0 lp/mm. The present disclosure provides the solution to that problem by enabling four sided tiles and very small spacing between the tiles. In the present disclosure the photo-die is cut from a wafer by anisotropic etching of silicon at the border of the photo-die. Photodiodes are brought almost to the edge of the photo-die. Edge of the border is defined by photolithography precisely and the sidewalls of photo-die can be made precisely vertical by plasma etching. Edge of the photo-die is thus away from photodiode by half the spacing between diode. For example, in a 20 micron photo-pixel half the spacing between diode is 10 microns. Existing technology for photolithography and plasma etching has accuracy of less than one micron. Precision tiling is done by butting two photo-dies to each other and against a reference edge on the side followed by gluing of the two photo-dies to a substrate. Reference edge may be an edge of any large die cut from a wafer precisely by anisotropic plasma etching. Once two wafers are aligned and glued to a substrate, a third photo-die may be aligned to any one of the two photo-dies already aligned. This way a large panel of X-ray detector may be constructed.

Typical 2D silicon X-ray detector is limited to three transistors per pixel due to the yield. Thus any additional circuit in a silicon detector would further affect the yield. The performance, power and cost may be improved very significantly if more transistors could be added to the X-ray detector. The present disclosure provides solution to increasing number of transistors significantly. Each sense-pixel size is very close to photo-pixel size. A large number of transistors may be placed in one sense-pixel. For example, as many as 400 to 1600 transistors may be placed in one 20 micron×20 micron sense-pixel depending on the lithography node. Therefore, instead of placing addressing circuits at the edge of sense-die, the addressing circuit may be placed in the available space in the sense-pixel in sense-dies by being distributed over many sense-pixels. In addition, several other signal processing and data processing circuits may be placed with the sense-pixel space. One major benefit with adding these circuits within the sense-pixel would be lower noise resulting in higher image quality at lower dose of X-rays.

The 3D pixel array X-ray detector in the present disclosure provides solution to build very large area X-ray detector. The X-ray detector according to the present disclosure has very high resolution and contrast to give very high image quality. The X-ray detector according to the present disclosure solves the yield problem faced by earlier silicon detectors. The present disclosure also provides a means of tiling 3D X-ray detector seamlessly. The present disclosure further provides means of adding a large number of circuit functions to sense-die to improve performance, functionality, power and overall cost.

Example First Embodiment

The first embodiment of the present disclosure encompasses an indirect silicon X-ray detector (herein interchangeably referred to as "detector") structure built with an array of three dimensional (3D) pixels and integrated pixel addressing circuits. The detector has continuous array of 3D pixels with equal spacing and no breaks to cause discontinuity in the image due to missing pixel rows and columns.

Figure 5A:
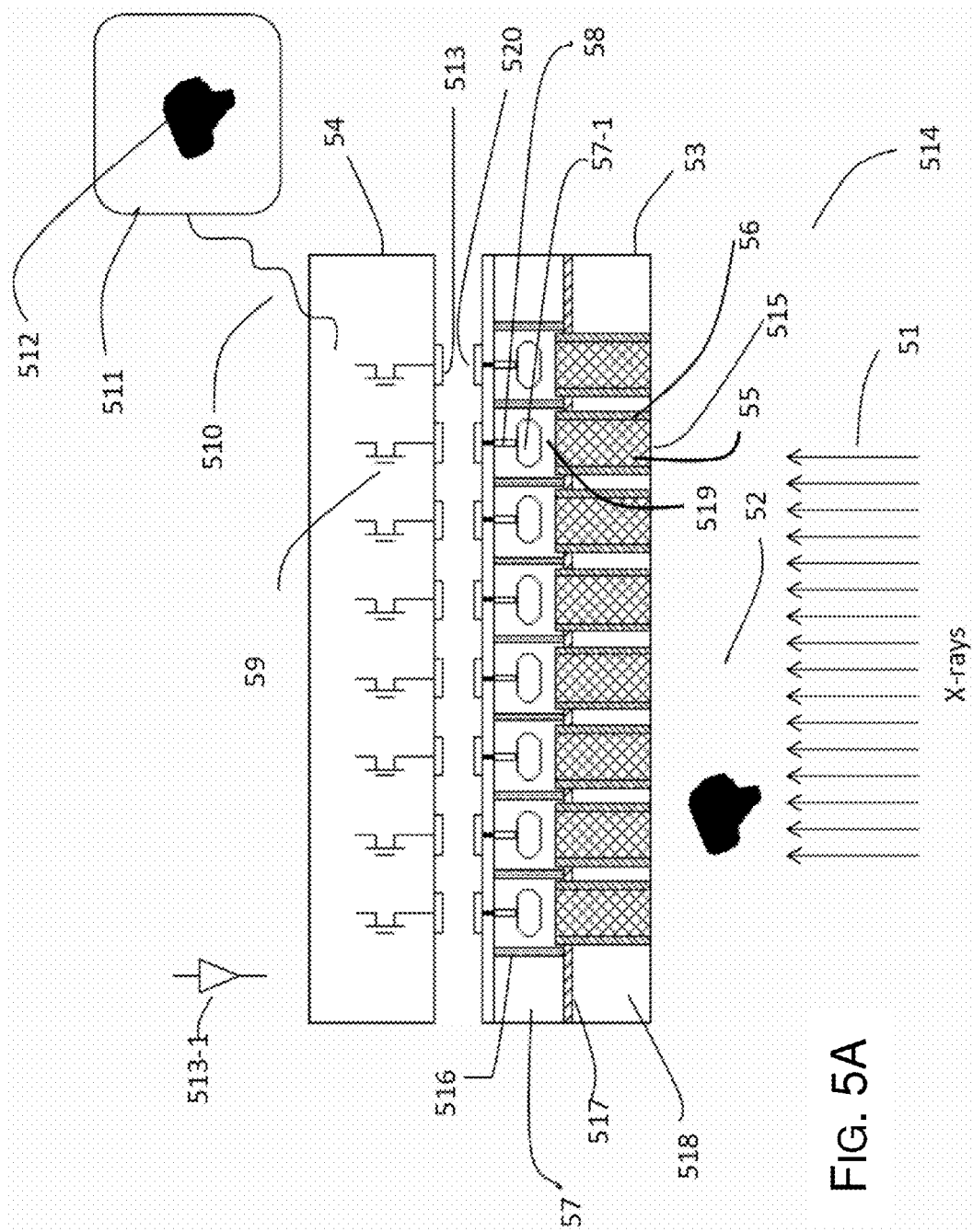
FIG. 5A shows X-rays incident on the X-ray sensor of the present disclosure and connection to computer to display an image of an object being observed.

FIG. 5A shows operation of an X-ray detector in accordance with an embodiment of the present disclosure. The function of a 3D pixel is to convert incident X-rays 51, which illuminates object 52, into an electrical signal 510 proportional to amount of X-ray photons to shown an image 512 of object 52 in a display device 511. Each 3D pixel has two components; photo-pixel and sense-pixel. Photo-pixel coverts X-ray into light and the light is converted into electronic charge by the photodiode embedded in the photo-pixel. Sense-pixel includes a circuit made with transistors and capacitors. An input contact to this sense-pixel circuit is connected the photodiode in the photo-pixel to sense the electronic charge on the photodiode. An array of photo-pixels is made on a first silicon substrate or a die (photo-die), and an array of sense-pixels is made on a second silicon substrate or a die (sense-die). Sense-die is placed on the photo-die and aligned precisely so that the photodiode contact is connected to the input contact of the corresponding sense-pixel on the sense-die. The present disclosure describes structure and method to place sense-die on the photo-die and precisely align them to form an array 3D pixel for sensing X-rays.

Referring to FIG. 5A, a cross-section of the X-ray detector structure 514 is described below. The detector has two silicon dies: photo-die 53 and sense-die 54.

Herein a description of photo-die 53 is provided. Referring to FIG. 5A, in some embodiments photo-die 53 may be fabricated using a silicon substrate or a silicon-on-insulator (SOI) substrate such as a wafer. The SOI wafer has three regions, including first silicon layer 518, insulator layer 517, and second silicon layer 57. The SOI wafer has several holes 515 on the back side of the wafer in region 518, traversing through insulator layer 517 and partially into p region 519. Each of holes 515 has a sidewall layer 56 and a layer on the bottom (not shown for simplicity of the drawing). Impurity of n type is implanted in silicon layer 57 through the holes 515 to form an enclosed n region 57-1 just below the bottom of the holes 515 in the p region 519. A PN junction or a photodiode is formed at the interface of the n region 57-1 and p region 519. The electrical symbol for photodiode 513-1 is shown in FIG. 5A. Upper boundary of the PN junction is below the bottom of the holes 515. Side boundaries of the PN junction are perfectly aligned to the edges of the holes 515 because n implant is done through the holes 515. Each hole 515 is filled with a scintillator material 55 that coverts X-rays into visible light. Heavily doped, or n+, impurities are implanted from the front of the photo-die wafer in region 58 to connect n region 57-1 to the contacts 520 placed on the front side of the wafer. An insulator layer 516 is placed between any two adjacent PN diodes formed at the interface of the n region 57-1 and p region 519 to isolate the adjacent PN diodes electrically.

Herein a description of sense-die 54 is provided. Referring to FIG. 5A, in some embodiments sense-die 54 may be fabricated in a silicon wafer using standard industry CMOS process. Each sense-pixel has circuits that include one or more transistors such as transistor 59. Transistor 59 is the first amplifying transistor. FIG. 5A shows symbol rather than structure for the transistors 59 for simplicity of explanation. An input contact 513 is placed on the surface of the sense-die 54 and connected to one of the terminals of transistor 59. Complete structure of the sense-die 54 will be described later in the present disclosure.

Figure 5B:
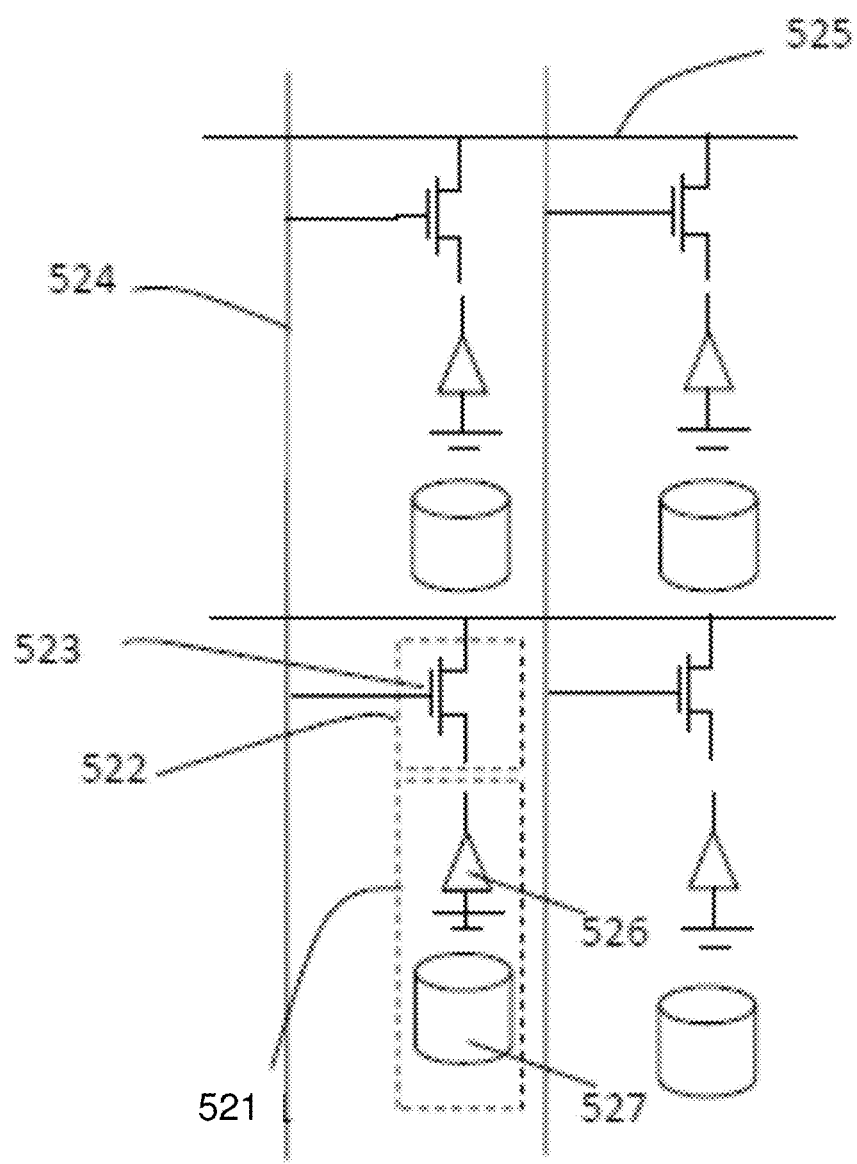
FIG. 5B is an electrical schematic of X-ray sensor of FIG. 5A showing an array of scintillator grid, photodiode and sensing MOS transistor.

Herein a description of 3D pixel array 514 is provided. Referring to FIG. 5A, in some embodiments, 3D pixel array 514 may comprise of photo-die 53 placed on sense-dies 54 face to face. A composite 3D pixel may include a sense-pixel and a photo-pixel. The photo-pixel is in photo-die 53. The sense-pixel and pixel addressing circuits (not shown) are in sense-die 54. A simple schematic diagram of pixel circuit is shown in FIG. 5B. Referring to FIG. 5B, sense-pixel 522 includes a transistor 523, column select line 524 and row sense and reset line 525. Photo-pixel 521 includes a photodiode 526 and a grid hole 527 filled with scintillator material, such as CsI for example. Scintillator material converts X-rays into light. The present disclosure describes a method of self-alignment of a photodiode with grid hole 55 as shown in FIG. 5A. Grid hole 55 acts as a waveguide to confine the light therein. A 3D pixel as shown in FIG. 5B is constructed by connecting sense-pixel 522 to photo-pixel 521. This connection is done by placing sense-die 54 on the photo-die 53 and aligning corresponding contacts precisely. Contacts 520 on the photo-pixels and corresponding contacts 513 on the sense-pixels as shown in FIG. 5A are aligned and bonded by the process described in U.S. Pat. No. 7,745,301 B2 by the inventor of the present disclosure. U.S. Pat. No. 7,745,301 B2 teaches a process and method of aligning two dies face to face with alignment accuracy of less than 1 micron. U.S. Pat. No. 7,745,301 B2 also teaches method of bonding contacts on two dies so that connection from the circuits on one die can be made to the second die vertically to enable 3D integration of two dies. U.S. Pat. No. 7,745,301 B2 further teaches a process and method to place, align and bond several dies on a base die (bottom die) face to face so that vertical connections are made from base die to several dies on the top.

Figure 6:
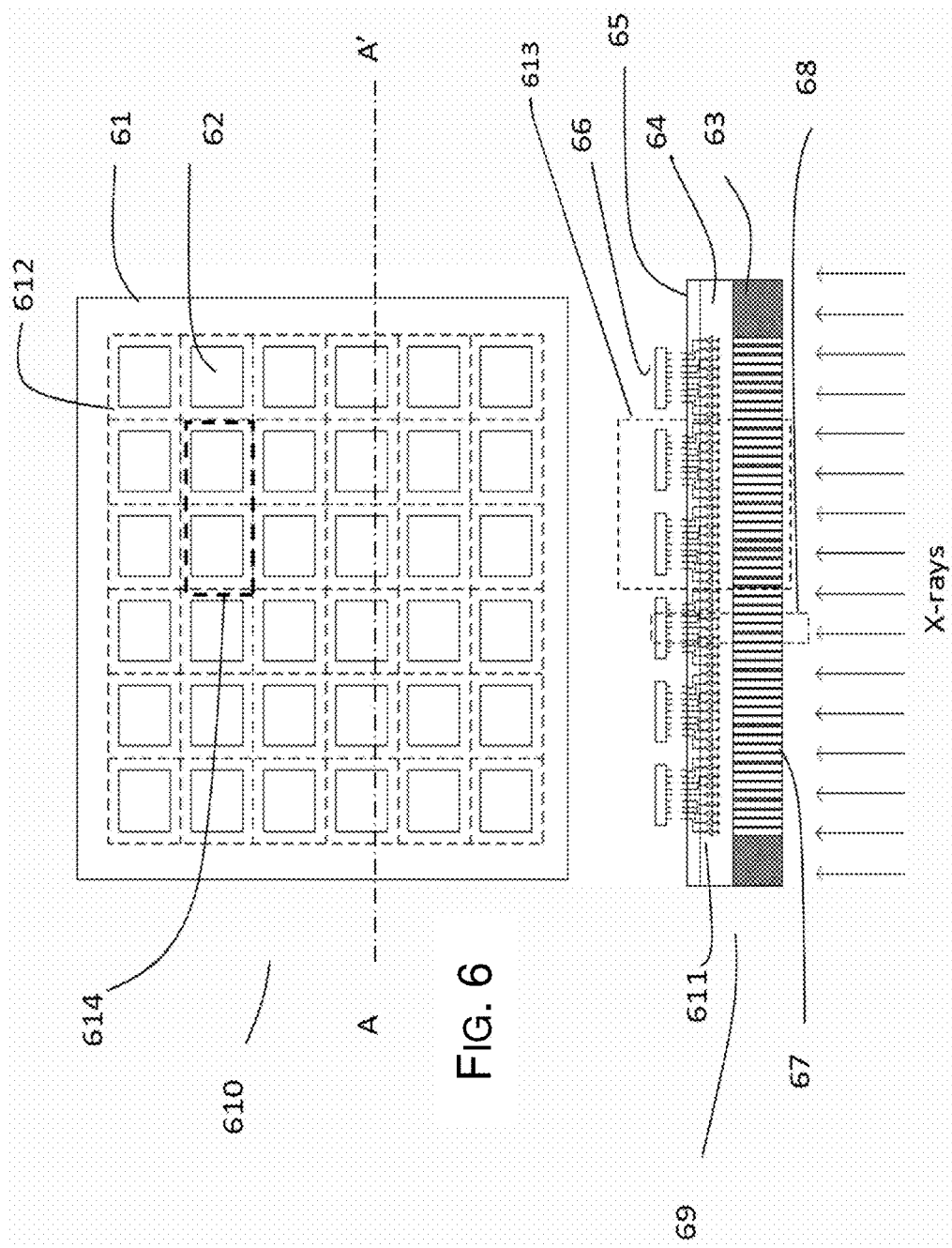
FIG. 6 shows a top view and a cross-section AA' of an X-ray detector.
Figure 6A:
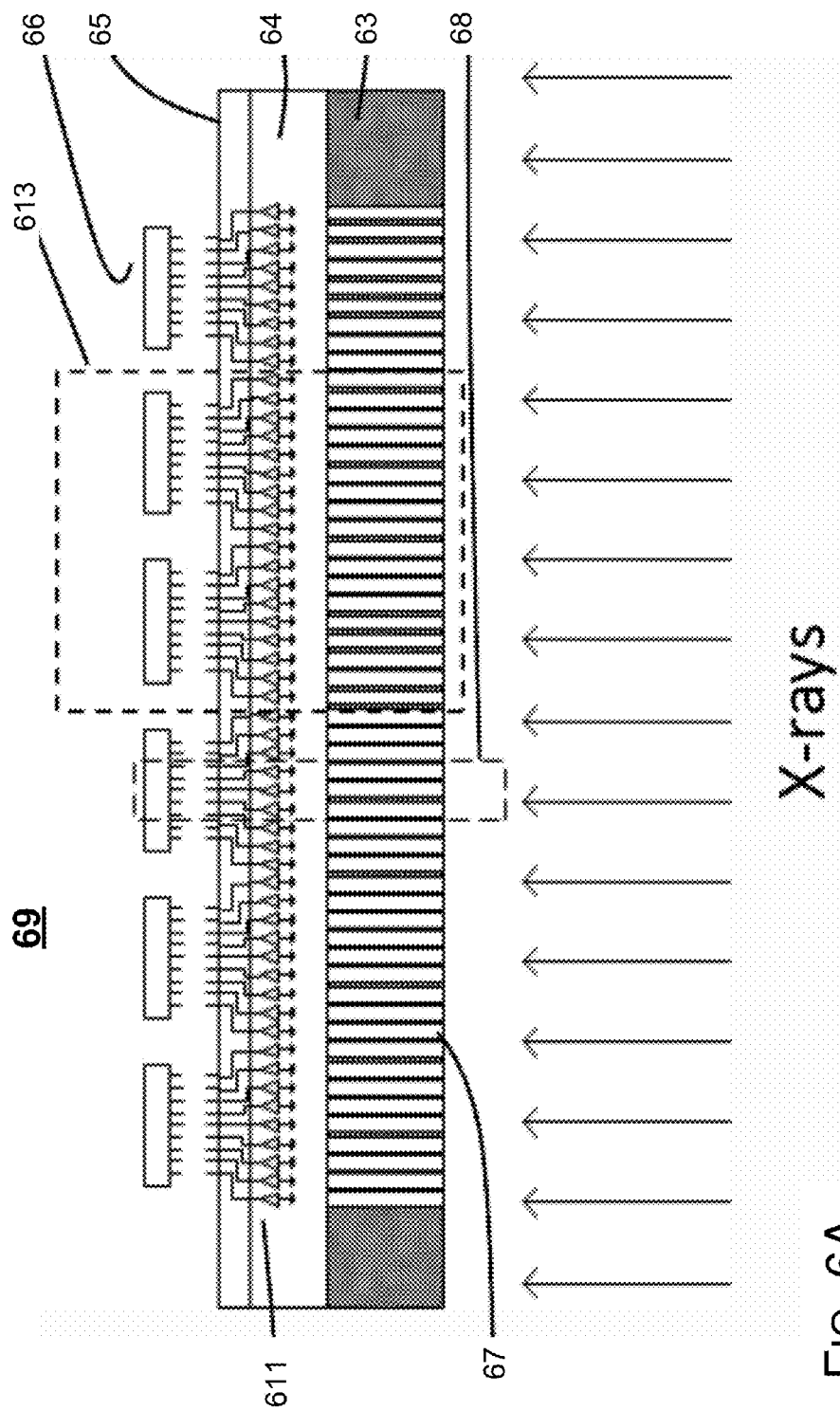
FIG. 6A is an enlarged view of cross-section AA' of the X-ray detector.

FIG. 6 shows a top view 610 and a cross-section AA' 69 of an X-ray detector. FIG. 6A is an enlarged view of cross-section AA' 69 of the X-ray detector. Several sense-dies 62 (top view), 66 (cross-sectional view) are placed on a photo-die 61 (top view), 69 (cross-sectional view). A schematic view of photo-die 69 is shown for the ease of explanation. Holes filled with scintillator 67 are in silicon layer 63 of an SOI wafer. The photodiodes (shown in symbols) are formed in silicon layer 64 which is separated from the silicon layer 63 by a thin layer of an insulator (not shown for clarity). The photodiode array is continuous all across the wafer. Though the number of photodiode in the silicon layer 64 may be in the millions, a few are shown in FIG. 6 and FIG. 6A for the clarity of explanation. Contacts to photodiodes 611 are brought to surface through multilevel interconnect metal within an insulator 65. The photo-die 61, 69 is divided into a number of blocks or photo-blocks 612. Each photo-block 612 is connected to one sense-die. The dotted-line enclosure 614 in FIG. 6 shows top view of two sense-dies placed on two photo-blocks. Referring to FIG. 6, enclosure 614 in the top view of the X-ray detector 610 has two sense-dies on the top of two photo-blocks 612. The dotted-line enclosure 613 is shown in the cross-sectional view as enclosure 614 along section AA' in FIG. 6 and FIG. 6A. An enlarged view of the dotted-line enclosure 68 of FIG. 6 and FIG. 6A is shown in FIG. 10A.

Figure 7:
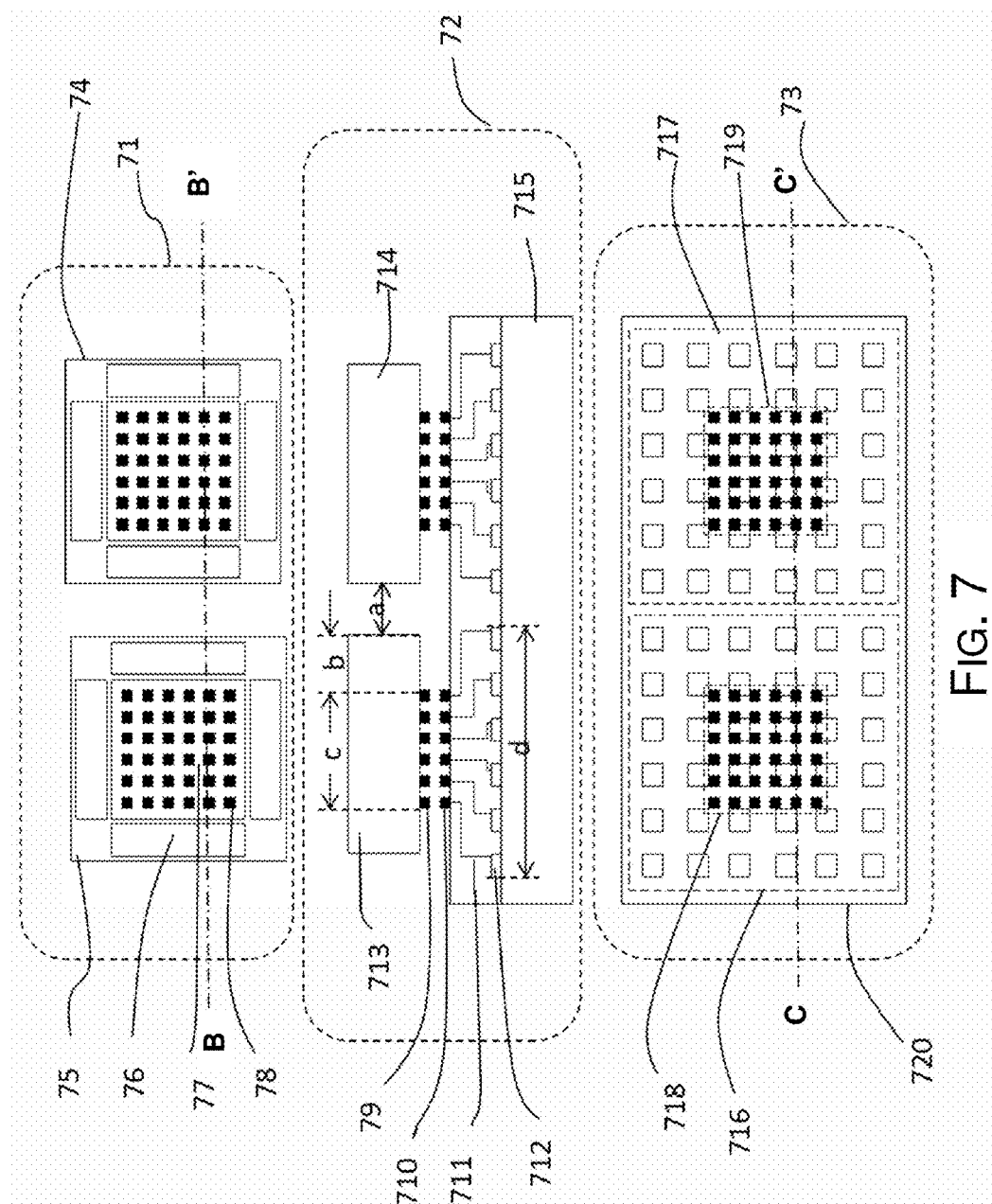
FIG. 7 shows sectional views and top views of assembled two photo blocks on the Photo-die and two sense-dies to demonstrate connection scheme.

An enlarged view of both enclosure 614 (top view) and 613 (cross-sectional view) is shown in FIG. 7 as 71 (top view) and 72 (cross-sectional view), respectively. A top view 73 of the part of the photo-die is also shown in FIG. 7. A scheme to connect sense-dies 74 and 75 (top view), 714 and 713 (cross-sectional view) to photo-blocks 716, 717 in photo-die 720 is described herein in detail. Detailed construction of photodiodes and scintillator grid in silicon substrate 715 is described later.

Referring to FIG. 7, in some embodiments sense-dies 74 and 75 (top view), 714 and 713 (cross-sectional view) may have an array of contacts on the top 77 (top view), 79 (cross-sectional view). Each contact is connected to a sense-pixel circuit. Pixel addressing circuits 76 are connected to pixels through rows and columns of metal lines. The two sense-dies 74, 75 are placed face down on the two photo-blocks 716, 717 of the photo-die 720 as shown in the cross-sectional view 72 along sections BB' and CC' of sense-die 74, 75 and photo-die 720. The contact to sense-pixel 78 cannot be above the contact 712 of the corresponding photo-pixel. The reason is that a gap or space 'b' is needed by addressing circuits 76 and a gap or space 'a' is needed between the sense-dies 74, 75 to place and align them. The two contact arrays 77, 79 need to be apart by a distance a+2b. On the other hand the photodiode array is continuous hence the width 'd' of the first contact array 712 of photo-blocks 716, 717 is larger than the width 'c' of the contact array 77, 79 of the sense-dies. Therefore a second contact array 718, 719 is placed on the top of the photo-blocks 716, 717. The second contact array 718, 719 in photo-blocks 716, 717 is connected to the first contact array 712 in photo-blocks 716, 717 through multilayer interconnect 711 in cross section 72. The second contact array 718 in photo-block 716 is mirror image of to the contact array 77 of the sense-die 75. Cross section 72 shows how a contact 712 is connected to the corresponding contact 710 through multilayer interconnect 711.

FIG. 8 shows schematic cross-sectional view of sense-dies 81 placed just above the photo-die 82 and self-aligned to the contact array in the photo blocks 86. FIG. 9 shows schematic cross sectional view of a portion of a sense-die 93 in contact with a portion of the photo-die 94 after bonding. Sense-die 93 in FIG. 9 is then lowered on the contact array 96 and bonded thereto. The detector construction is complete as shown in FIG. 9. An enlarged view of the dotted-line enclosure 85 of FIG. 8 is shown in FIG. 10A. An enlarged view of the dotted-line enclosure 95 of FIG. 9 is shown in FIG. 10B. A 3D pixel 103 in FIG. 10A have a photo-die 102 and a sense-die 101. The photo-die 104 has scintillator grid hole 104, photodiode 105, and contact 107 connected to photodiode 105 through photodiode contact 106. The sense-die 101 has a sense-pixel transistor 109 and sense-pixel contact 108. Sense-pixel is connected to photo-pixel as shown in FIG. 10B to form a 3D pixel 1013. Sense-pixel transistor 1010 is connected to photodiode 1011 through bonded contact 1012.

Figure 11:
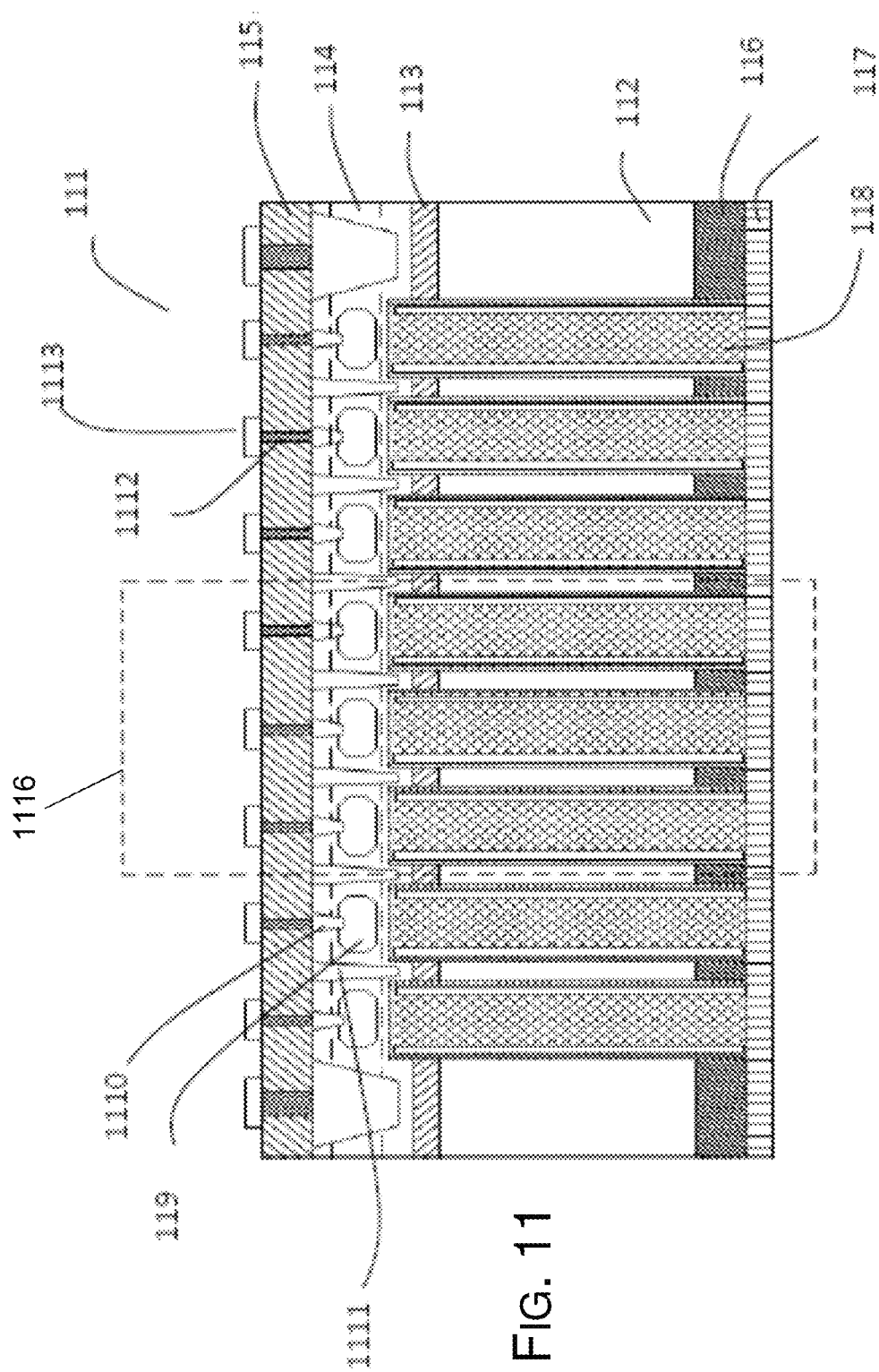
FIG. 11 is enlarged view of the photo-die in FIG. 5A to show structural details.

FIG. 11 shows details of p+ contact implant 115, p+ isolation implant and n+ contact implant 1110.

A part of photo-die in enclosure 85 of FIG. 8 is shown in FIG. 11. The photo-die 111 of FIG. 11 is constructed on a SOI wafer. The physical structure of the photo-die 111 is described below. Detailed step by step process flow will be described later in the present disclosure.

The main feature of this construction is the perfect alignment of photodiode with the grid hole filled with scintillator material. This integration of the photodiode with perfectly aligned grid hole with scintillator material, such as CsI, is one of several unique features of the present disclosure. Essentially this is the creation of light waveguide to focus all of the light on the photodiode above the grid hole with minimum loss of X-rays, light or electron-hole pairs generated in photodiode. The grid holes 118 in FIG. 11 are lined with a thin layer of oxide to make sure the light stays in the grid hole 118 and is incident of the photodiode made with n impurity regions 119 and p impurity region 114 (also referred to as common p region 114 herein). Grid hole 118 is filled with scintillator material such as CsI. The photodiode which is defined by the n impurity regions 119 is perfectly aligned with grid holes 118. The reason is that, prior to filling the grid hole with scintillator, n type of impurity is implanted in p impurity region 114 through grid holes 118. Side wall of each of the grid holes 118 will prevent implanted impurity from spreading sideways. The insulator layer 113 separates silicon layer 112 and p impurity region 114. The grid holes 118 are made deeper than the thickness of layer 112. The reason is to make sure that the light generated in grid holes 118 does not travel to adjacent diode through oxide 113. The n impurity region 119 of photodiode is connected to the first contact 1113 through n+ implant 1110 and contact fill metal 1112 in the oxide 115. Construction of the second contact to photo-pixel will be disclosed later. Layer 1111 is p+ implant or trench oxide to electrically separate each photodiode and its neighboring photodiode(s). The p+ implant or trench oxide 1111 is placed within common p region 114. A thin layer of oxide and silicon nitride (herein interchangeably referred to as oxide/nitride layer) 116 is deposited on the back side of the silicon layer 112. All the grid holes 118 are covered by an insulator 117.

Figure 12:
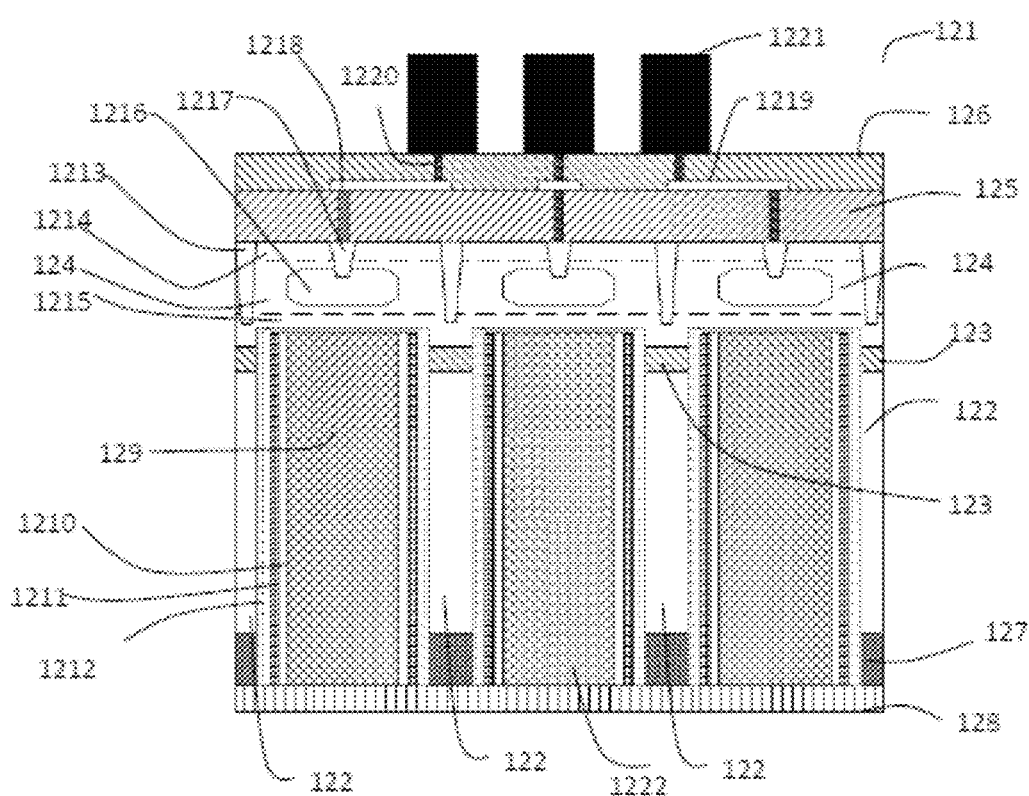
FIG. 12 shows more details of the enclosure of FIG. 11.

The dotted-line enclosed area 1116 in FIG. 11 containing three photo-pixels is shown as section 121 in FIG. 12 for clarity and details of construction. Referring to FIG. 12, the grid hole 129 filled with scintillator material, such as CsI, is separated from neighboring grid hole 129 by silicon 122. A thin layer of oxide and silicon nitride (herein interchangeably referred to as oxide/nitride layer) 127 is deposited on the back side of the silicon layer 122. All the grid holes are covered by an insulator 128. Sidewalls of the grid holes 129 have an insulator stack whose dielectric constant is such that light remains in the grid holes 129 due to total internal reflection. With respect to grid hole 129, this is the effect that creates the light waveguide to focus the light beam in the grid hole 129 onto the photodiode that is perfectly aligned with the grid hole 129. In FIG. 12, the photodiode is defined by edges of n region 1216 within p region 124 (also referred to as silicon layer 124 herein). Using grid hole 129 as an example, the self-alignment of n region 1216 with grid hole 129 is accomplished by implanting n impurities through grid hole 129 before filling with scintillator material 1222. The insulator stack on the side wall of grid hole 129 includes thin oxide layer 1212, thin nitride layer 1211 and oxide layer 1210 (e.g., silicon dioxide). Typical thickness of thin oxide layer 1212 is 100 Å, typical thickness of thin nitride layer 1211 is 50 Å, and typical thickness of oxide layer 1210 is 3000 Å. In some embodiments, oxide layer 1210 may be replaced by a reflecting metal layer, such as aluminum or chrome for example, to confine light in the grid hole 129. The grid hole 129 penetrates the oxide layer 123 and part of silicon layer 124 to ensure that light generated within each grid hole 129 does not scatter to neighboring photodiode through layer 123 between the grid holes 129.

In some embodiments, a first contact 1219 to the n region 1216 of the photodiode may be made through contact fill metal 1218 in insulator 125 which may be an oxide layer, and n+ implant 1217. State of the art contact metallurgy is used to form contact fill metal. The photodiodes are isolated from each other by a trench 1213 filled with insulator. Alternatively, the photodiodes may also be isolated from each other by creating a p+ region replacing insulator-filled trench 1213. A p+ layer 1215 is created at the interface of the bottom of grid holes 129 and p region 124 to prevent inversion. Undesirably, inversion will cause generation of electrons and holes that will create leakage and noise. A p+ layer is also created at the interface of the p region 124 and bottom of insulator 125 to prevent inversion and hence leakage and noise. A second contact 1221 is connected to the first contact 1219 through contact fill metal 1220 in insulator 126 which may be an oxide layer. Layer 1214 is p+ implant or trench oxide to electrically separate each photodiode and its neighboring photodiode(s). The p+ layer or trench oxide 1214 is placed within common p region 124. The pitch of second contacts 1221 is smaller than the pitch of photodiodes. The reason for that difference was described in detail earlier with reference to the explanation of FIG. 7. The contacts 710 in FIG. 7 correspond to contact 1221 in FIG. 12. The components of the photo-pixel include: (1) grid holes, such as grid hole 129, filled with scintillator 1222 and lined with insulator stack, (2) self-aligned photodiodes defined by n region 1216 and p region 124, and (3) the first contacts 1219 laterally shifted to center under the second contacts 1221.

Figure 13A:
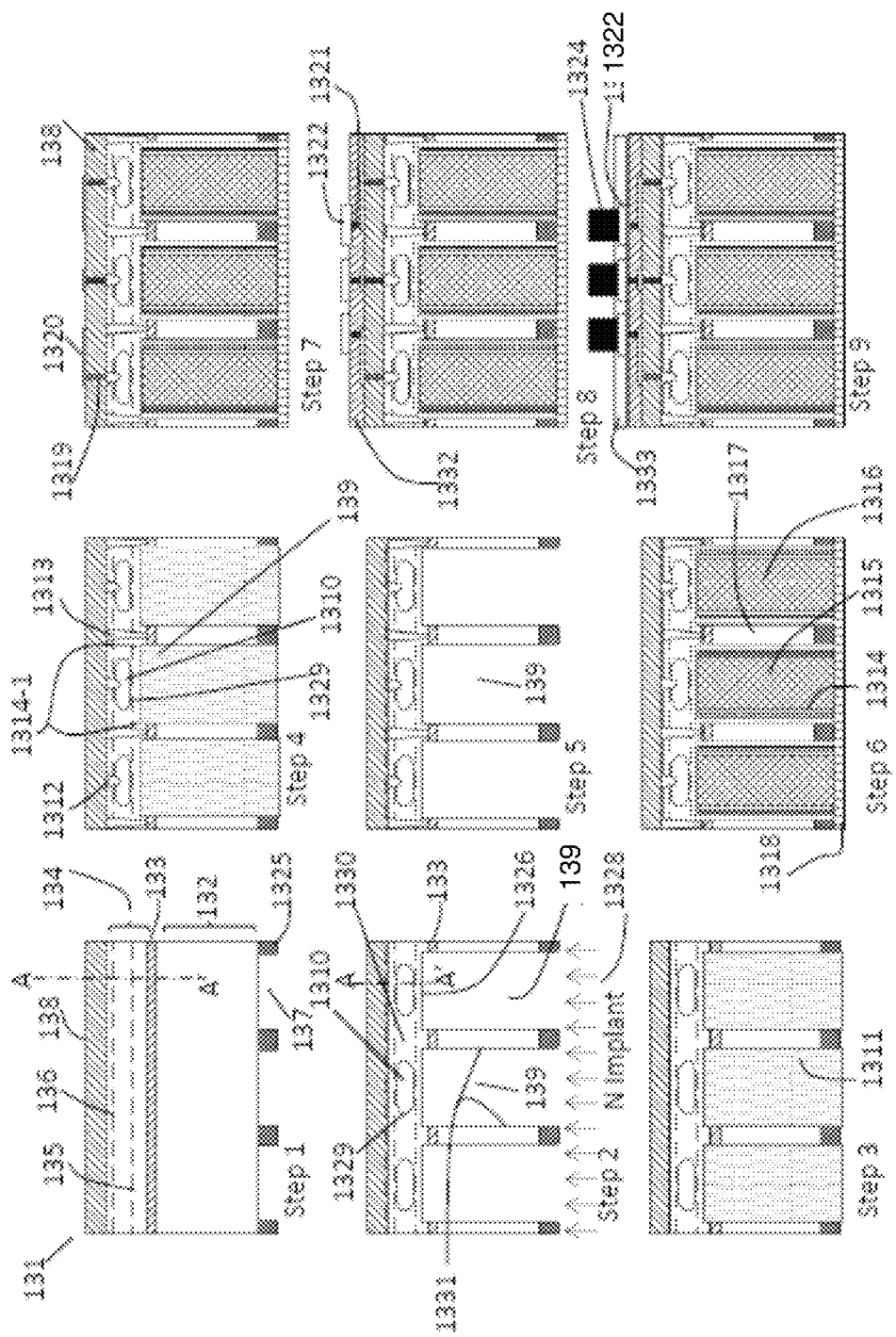
FIG. 13A shows detail process steps of construction structure of FIG. 12.
Figure 13B:
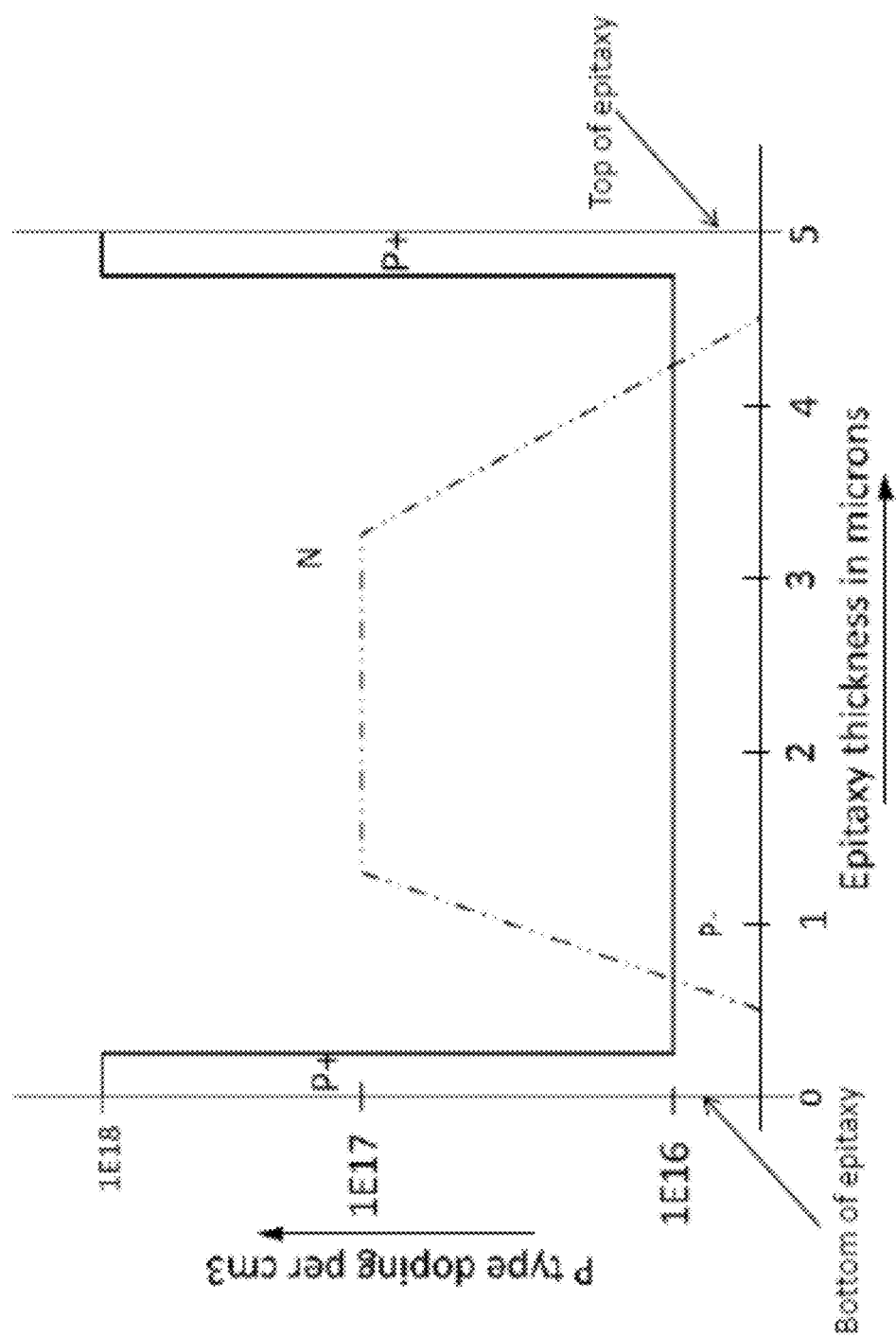
FIG. 13B shows doping profile near photodiode in FIG. 12.

FIG. 13A shows detail process steps of construction structure of FIG. 12. FIG. 13B shows doping profile near photodiode in FIG. 12. As shown in FIG. 13A, the fabrication process for photo-die starts with a SOI wafer 131. The SOI wafer 131 has a thick back substrate 132, buried oxide 133 and an epitaxial layer 134 as shown in FIG. 13A.

At step 1 of the fabrication process, silicon oxide (herein interchangeably referred to as oxide) 138 is deposited or grown on the front surface of the wafer 131. The vertical doping profile of the p-type epitaxial layer 134 along AA' is shown in FIG. 13B. This profile shows formation of three layers, namely first p+ layer, p layer and second p+ layer. The interface 136 of first p+ layer and p layer near the top of epitaxial layer 134 and the interface 135 of p layer and second p+ layer near the bottom of epitaxial layer 134 are shown corresponding to doping profile in FIG. 13B. A thin layer of oxide and silicon nitride (herein interchangeably referred to as oxide/nitride layer) 1325 is deposited on the back side of the wafer 131. An array of holes 137 are etched in the oxide/nitride layer 1325 on the back side of the SOI wafer 131 by using photolithography and plasma etching.

Referring to FIG. 13A, at step 2 of the fabrication process, using state of the art anisotropic plasma etch method the silicon in the holes 137 is etched till oxide layer 133 is reached, which is a natural stop from further etching, to form an array of grid holes 139. Anisotropic wet etch process, e.g., using KOH, may also be used if starting wafer substrate of <110> crystal orientation. Anisotropic oxide plasma etch method is then used to etch oxide/nitride layer 1325 with little or no undercut. Next, an anisotropic plasma silicon etch method at very slow etch rate is used to etch silicon so that top 1326 of the grid hole 139 reaches, or exceeds, boundary of buried oxide 133. Then, n type impurity 1328 is implanted through grid holes 139 in p-type epitaxial layer 134 by ion implantation to form n region 1310 of PN photodiodes. The vertical profile through p and n regions of photodiodes along section AA' in the epitaxial layer 134 of FIG. 13A is shown in FIG. 13B. The PN junction 1329, thus formed by the p region 1330 and n implant region 1310, is perfectly aligned to the side walls 1331 of the grid holes 139.

As an example, key dimensions of the wafer 131 at this stage are disclosed. However, these dimensions may vary depending on the design requirement of the detector. The typical thickness of silicon substrate 132 may be 400 microns to 800 microns. Typical thickness of the oxide 133 may be 3000 Å. Typical thickness of epitaxial layer 134 may be 4 microns. The PN junction depth from the bottom of the grid holes 139 may be 0.25 micron to 0.5 microns. This is just one profile design example. Specific dimensions will depend on the specific requirement of a given X-ray detector.

Referring again to FIG. 13A, at step 3 of the fabrication process, grid holes 139 are filled with oxide 1311 by chemical vapor deposition (CVD) and the back surface thereof is polished. The purpose of filling oxide 1311 in the grid holes is to prepare the wafer 131 for further high-temperature processing and mechanical handling.

At step 4 of the fabrication process, wafer 131 is processed from the front side. Here, p+ implants 1313 and n+ implants 1312 are done by using state of the art wafer processing methods. The p+ implants 1313 are to isolate photodiodes 1329. The n+ Implants 1312 are for connecting n region of the photodiode 1329 to the metal contacts as shown in step 7 and step 8 to be described below.

The method of aligning masks for n+ implant regions 1312 to grid holes 139 will be described now. Looking from the top of the front side of the wafer 131, grid hole perimeter 1314-1 can be seen clearly because of difference in the absorption of light in silicon inside the grid hole 139 and outside the grid hole 139. The reason is the thickness of silicon in the grid hole 139 is less than 5 microns and hence most of light goes through the silicon. On the other hand, thickness of silicon outside the grid hole 139 is very thick and will absorb all the light, and hence a very good contrast between inside and outside the grid hole 139 can be seen. The perimeter 1314-1 of the grid hole 139 can be seen easily and can be used to align n+ implant region 1317. Subsequent masks can be aligned to n+ implant region 1317. An alternative method of alignment is also described here. Two or more alignment patterns are aligned to the grid holes and defined by photolithography on the backside of the wafer and are etched anisotropically all the way through the wafer 131 from the backside. Now the same alignment patterns will show up in the front side of the wafer 131. These patterns can be used to align n+ implant regions 1312 of step 4 of FIG. 13A. Subsequent masks can be aligned to n+ implant region 1312.

Referring to FIG. 13A, at step 5 of the fabrication process, a thin nitride layer is deposited on the front surface of the wafer 131 (not shown). Then, oxide from the grid holes 139 is removed by wet etches.

At step 6 of the fabrication process, an oxide/nitride/oxide composite layer 1314 and scintillator material 1316 are deposited in grid hole 1315. Back surface of the wafer is polished, and a layer of oxide and a layer of nitride 1318 are deposited. Then, wafer 131 is heated to 680° C. to crystalize the scintillator material 1316. Different temperatures to heat or crystallize the scintillator material 1316 may be used depending on the scintillator material 1316 and/or the process needed. The dopant in epitaxial layer 134 is not affected at this temperature. FIG. 12 shows the details of deposition of thin oxide layer 1212, thin nitride layer 1211, oxide layer 1210 and scintillator material 1222 such as CsI. As examples of the typical thickness, thin oxide layer 1212 may be 100 Å, thin nitride layer 1211 may be 100 Å, and oxide layer 1210 may be 3000 Å. In actual design the thickness may change depending on the specification of the detector.

Referring again to FIG. 13A, at step 7 of the fabrication process, nitride (not shown) is removed from the front surface. Contact holes 1319 are filled with metal, and first metal contacts 1320 are placed on the contact holes 1319.

The details are shown in FIG. 12. Here contact holes 1218 are filled with metal and covered with first metal contacts 1219.

Referring to FIG. 13A, at step 8 of the fabrication process, insulator 1332 is deposited on the first metal contacts 1320. Then, contact holes 1321 are formed and filled with metal, and second metal contacts 1322 are formed. First and second metal are filled by using state of the art silicon processing methods. Next, at step 9 of the fabrication process, an insulator layer 1333 is placed on the second metal contacts 1322, and a via hole is opened and filled with metal (not shown). Copper pillars 1324 are then formed on the top of the second vias using state of the art processing methods. The wafer 131 can now be diced to form a rectangular die of desired dimension for the X-ray detector. Typical size may be 20 cm×20 cm square dices from a 300-mm diameter wafer.

The processing and construction of the photo-die is now complete. Referring to FIG. 8, a plurality of sense-dies 81 are placed on the photo-die 82.

Figure 14:
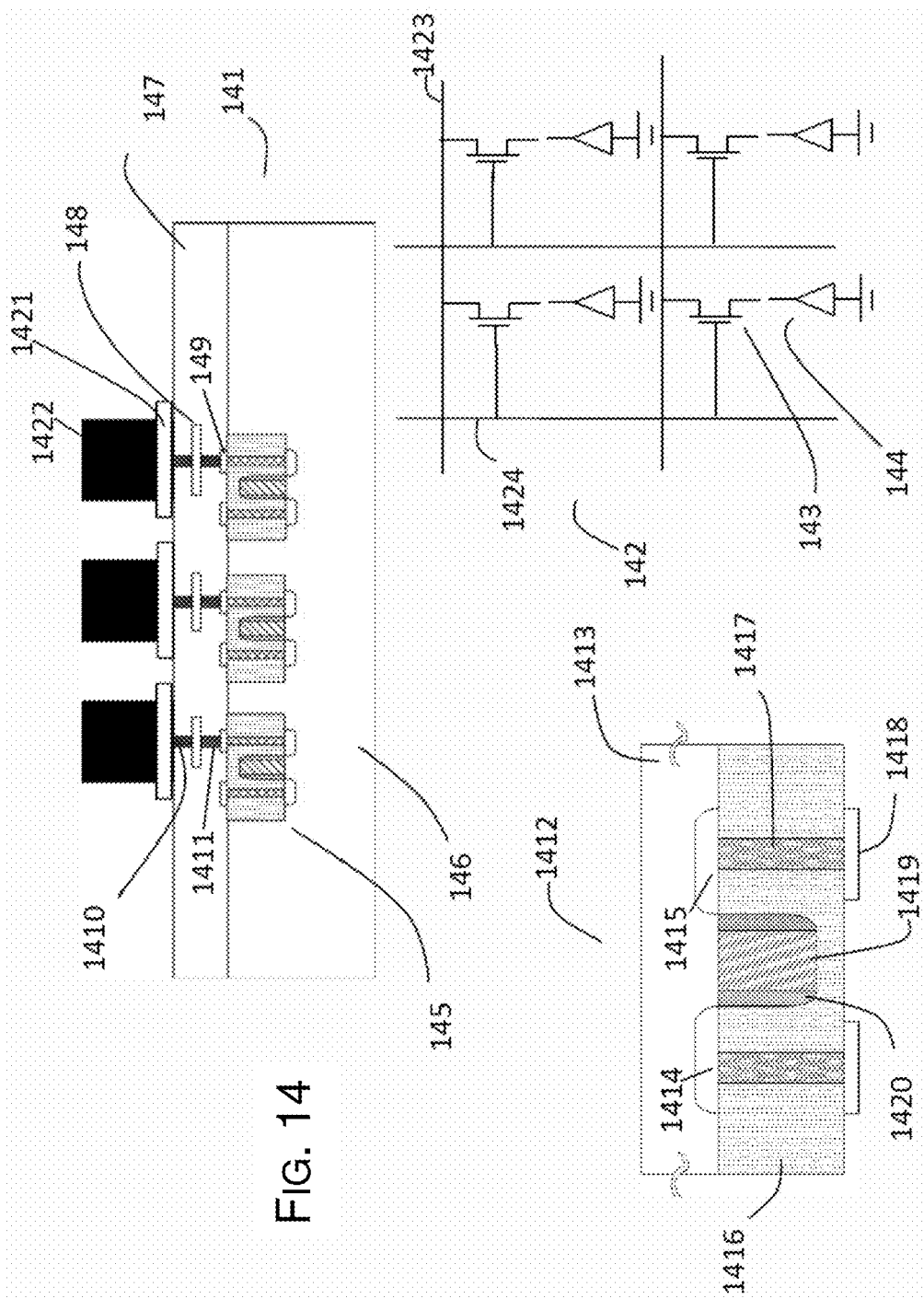
FIG. 14 shows sectional views of sense chip with MOS transistors and electrical schematic four 3D pixels.

FIG. 14 shows a structure 141 of sense-die 141 corresponding to the sense-die 101 of FIG. 10A. The process to make this die may involve state of the art CMOS process, and details of the process will not be presented herein. A typical NMOS transistor 145 (cross-sectional vie), 1412 (detail view) is fabricated in a p-type well 146 inside an n-type silicon substrate (not shown) of FIG. 14. Gate oxide (not shown), polysilicon gate 1419, spacers 1420, n+ source 1414 and n+ drain 1415 are formed in the p-type well 146 (cross-sectional view), 1413 (detail view) inside the n-type silicon substrate. Then, the contact holes 1417 are created in the insulator 1416 followed by the first metal 1418 formation as shown in FIG. 14. Next, a contact 1411 is placed on first metal 149 followed by formation of second metal 148 on the contact 1411. More than two layers of metal interconnect may be used depending on the process selected from a CMOS foundry. A contact 1410 is placed on the second metal 148 followed by final metal 1421. Metal pillars 1422, e.g., made of copper, are then formed on the final metal 1421. Pillars 1422 made of any other suitable metal also may be used with this construction. By using multilevel interconnect in the insulating layer 147 the NMOS transistors 145 (cross-sectional view), 143 (schematic view) are connected by row sense and reset lines 1423 and column select lines 1424 in an array 142. Photodiodes 144 of a photo-die are also shown in the schematic view. This completes physical construction of sense-die 101 of FIG. 10A.

Figure 15:
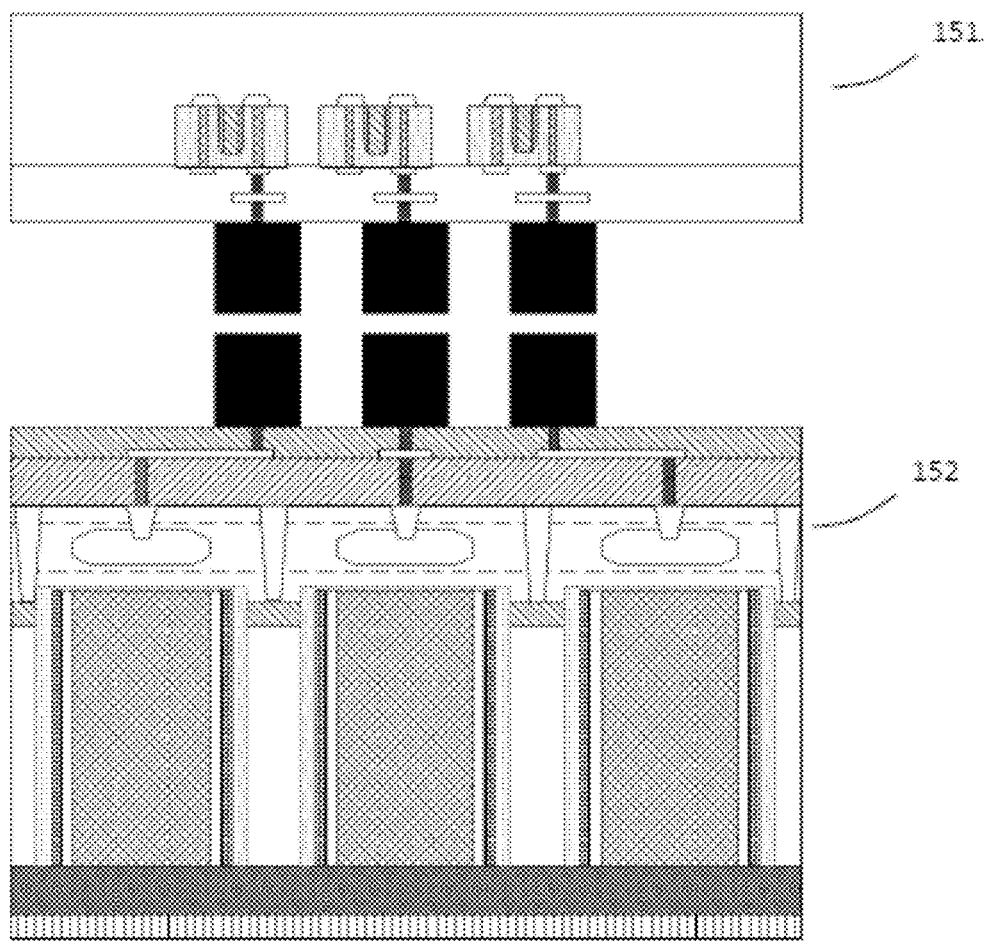
FIG. 15 shows the detail view physical sense-die placed over the photo-die corresponding to schematic view in FIG. 10A.
Figure 16:
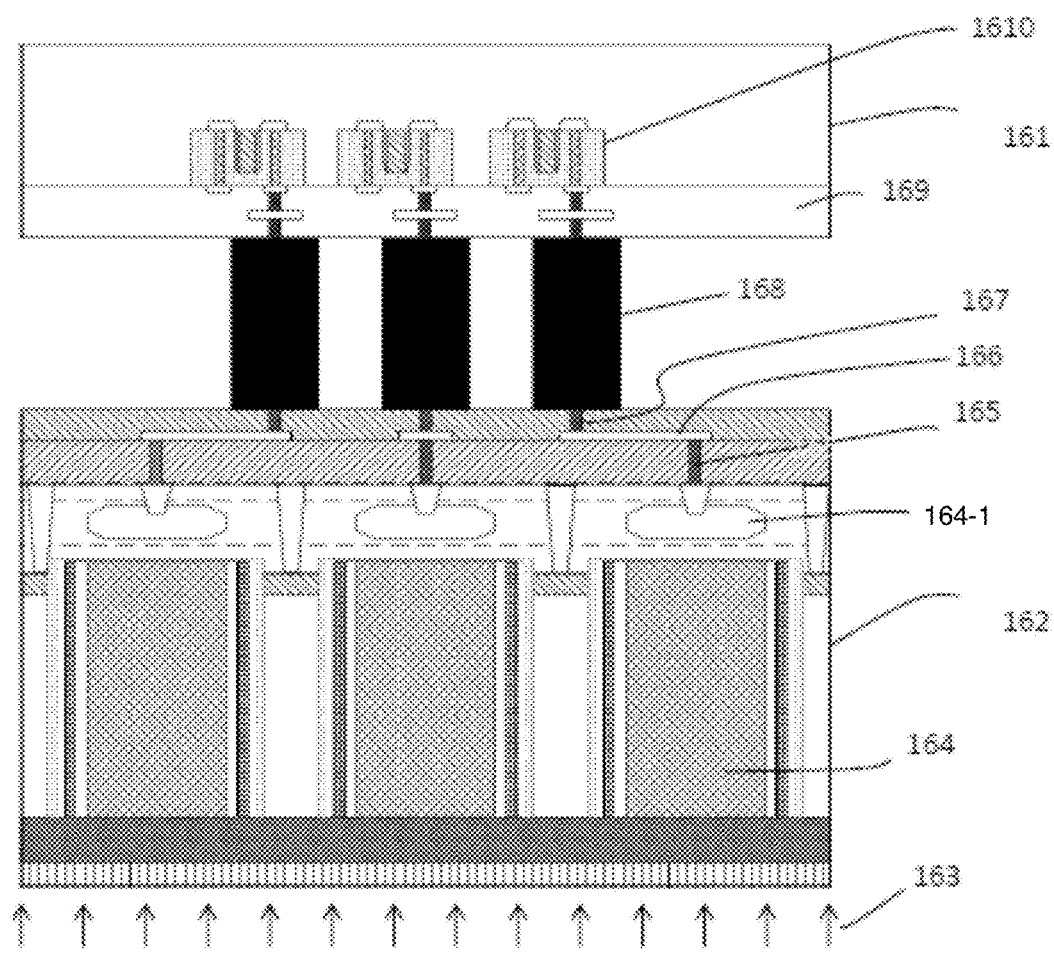
FIG. 16 shows detail view of sense-die and photo-die after bonding corresponding to FIG. 10B.

FIG. 15 shows a physical sense-die 151 placed over a photo-die 152 corresponding to schematic view in FIG. 10A. FIG. 16 shows detail view of sense-die and photo-die after bonding corresponding to FIG. 10B. Referring to FIG. 15, sense-die 151 is aligned accurately on the photo-die 152 by the method described in U.S. Pat. No. 7,745,301 B2. Referring to FIG. 16, after alignment, sense-die 161 is lowered onto the photo-die 162 corresponding to the schematic view of FIG. 10B. Then, sense-die 161 is bonded to photo-die 162 by applying pressure to the sense-die 162 and heating both sense-die 161 and photo-die 162 so as to diffuse copper to become one piece. Sense-die 161 has a structure similar to that of sense-die 141 of FIG. 14, and includes, among other components, transistors 1610, insulating layer 169 and pillars 168. Photo-die 162 has a structure similar to that shown in FIG. 12 and senses beams of X-ray 163. Photo-die 162 includes, among other components, grid holes 164, n region 164-1, contact fill metal 165, first contacts 166 and contact fill metal 167.

Figure 17:
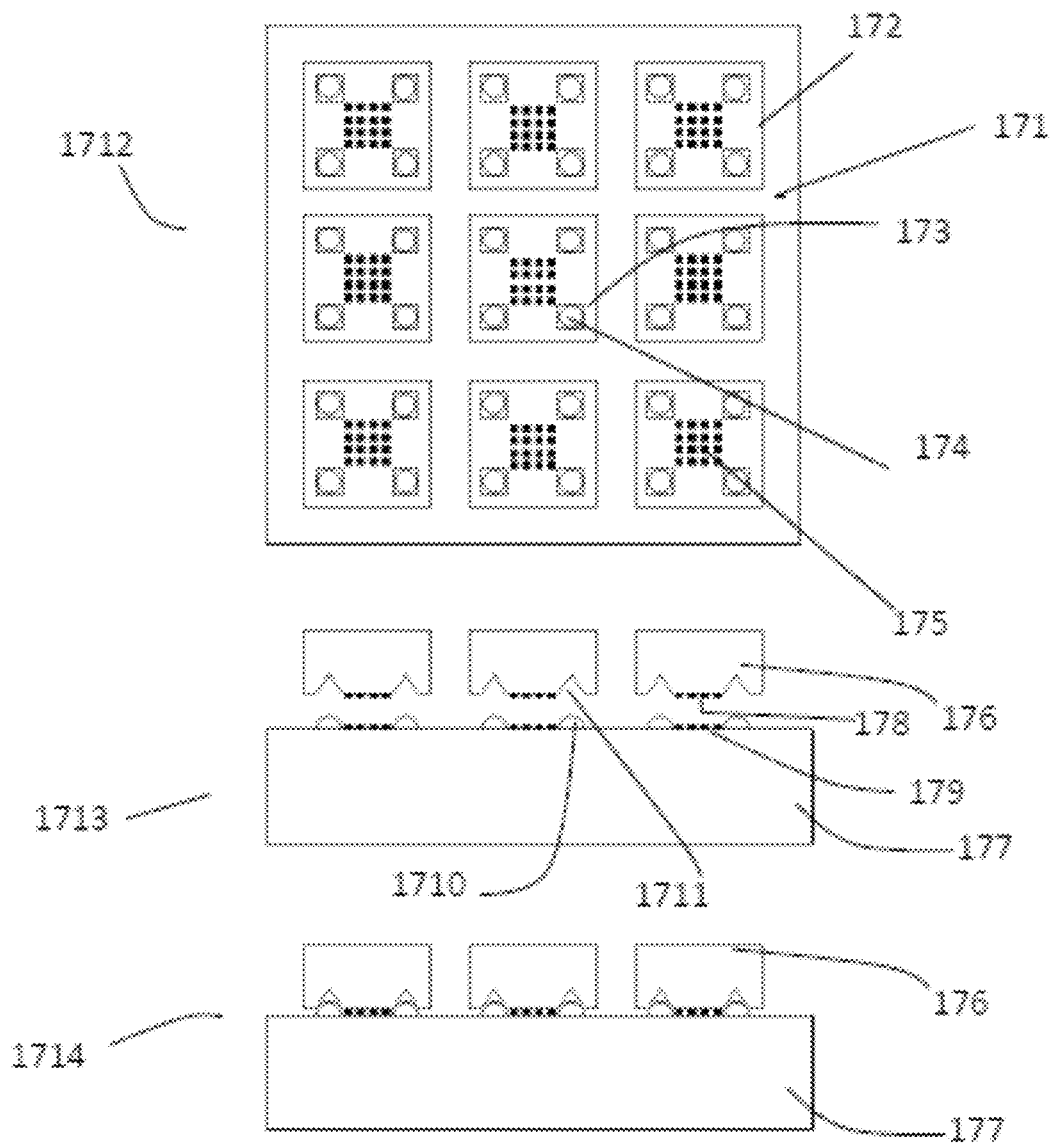
FIG. 17 shows sectional view and top view of a several small dies on a large die, aligned to each other using ball and groove method of Patent U.S. Pat. No. 7,745,301 B2 by this inventor.

Basic principle of U.S. Pat. No. 7,745,301 B2 can be described by FIG. 17 (prior art) and FIG. 18 (prior art). Referring to FIG. 17, the top view 1712 of bottom die 171 (top view), 177 (cross-sectional view) and top dies 172 (top view), 176 (cross-sectional view) as well as the cross-sectional views 1713 and 1714 demonstrate method of assembly of top dies and bottom die. Bottom die 171 (top view), 177 (cross-sectional view) have islands of contacts (copper pillars) 175 (top view), 179 (cross-sectional view) placed on the corresponding contacts 178 on top dies 172, 176. Each contact on the island of contact on the bottom die 171, 177 has corresponding contact on the top die 172, 176. Four precision V-shaped square grooves 173 (top view), 1711 (cross-sectional view) are made at the four corners of the top die 172, 176. Four precision hemispheric balls 174 (top view), 1710 (cross-sectional view) are deposited at the location exactly below the top dies 172, 176 using state of the art lead deposit and re-flow process. Top die 172, 176 is approximately placed above the bottom die 171, 177 by using state of the art pick and place tool as shown in in cross-sectional view 1713. Next, top die 172, 176 is released from the pick and place tool and dropped on the bottom die 171, 177 below. The side wall of the V grooves 173, 1711 guide top die to slide towards the bottom till all four side walls are touching the ball 174. At that point contacts 178 on the top die 172, 176 is perfectly aligned to the contacts 179 on the bottom die 171, 177. This type of alignment scheme also works if grooves are in bottom die and balls are in top die.

Figure 18:
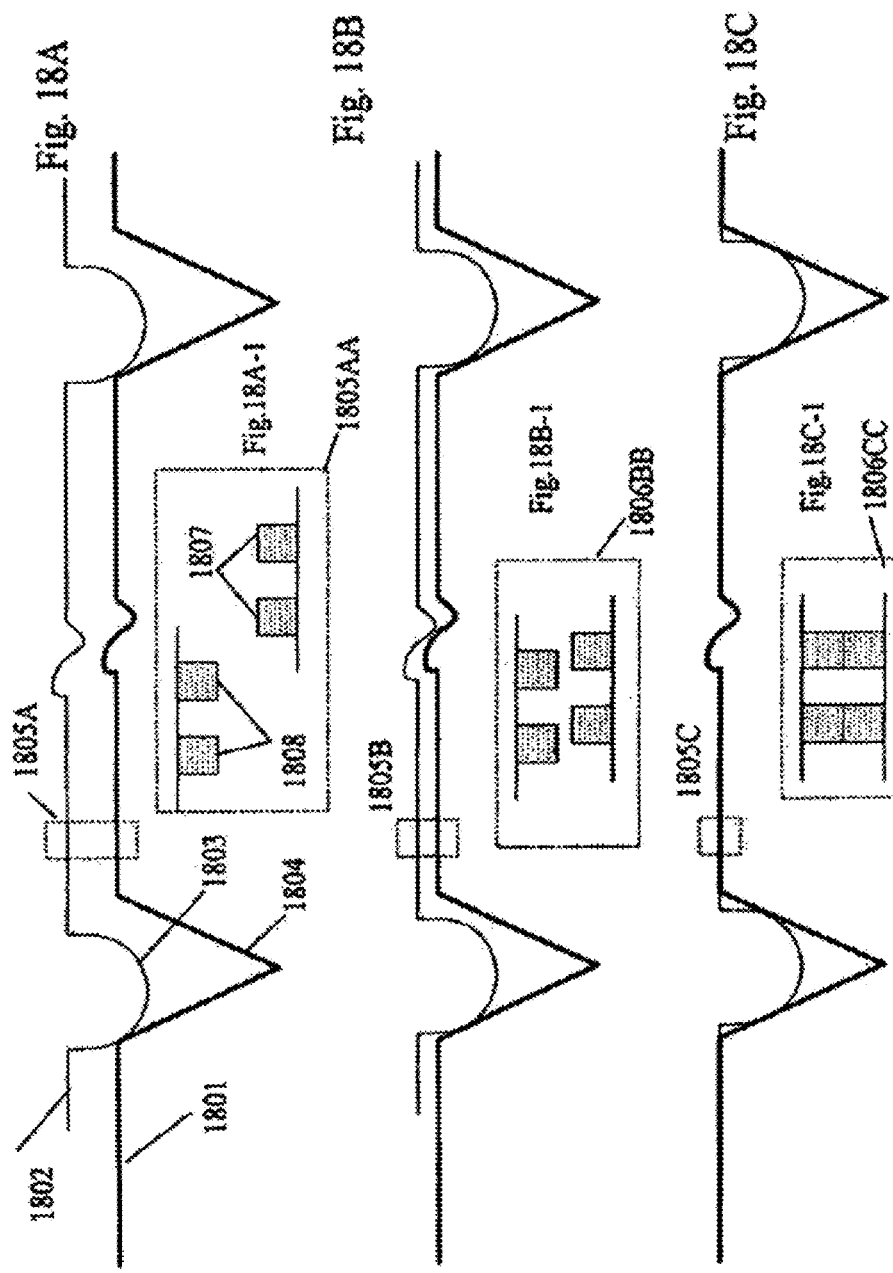
FIG. 18 includes FIG. 18A, FIG. 18B and FIG. 18C with each showing a respective stage of the alignment scheme of FIG. 17, with FIG. 18A including an enlarged view as FIG. 18A-1, FIG. 18B including an enlarged view as FIG. 18B-1 and FIG. 18C including an enlarged view as FIG. 18C-1.

FIG. 18 shows details of alignment scheme of FIG. 17. The surface profile of top die 1802 and bottom die 1801 are shown in FIG. 18 to show how contacts 1808 on top die 1802 will be perfectly aligned to the contacts 1807 in the bottom die 1801, with the aid of precision hemispheric balls 1803 and V grooves 1804, in three stages as shown in FIG. 18A, FIG. 18B and FIG. 18C. An enlarged view of each of dotted-line enclosures 1805A, 1805B and 1805C is correspondingly shown in view 1805AA of FIG. 18A-1 in FIG. 18A, view 1806BB of FIG. 18B-1 in FIG. 18B, and view 1806CC of FIG. 18C-1 in FIG. 18C. First stage is when the top die 1802 is just dropped on the bottom die 1801 as shown in FIG. 18A. Second stage is when top die 1802 is midway in slide as shown in FIG. 18B. Third stage is when the top die 1802 comes to rest and contacts 1808 and 1807 are perfectly self-aligned. An alternative scheme is to have balls on the bottom die 1801 and grooves in the top die 1802. In the present disclosure, photo-die 69 in FIG. 6 and silicon substrate 715 in FIG. 7 may each be bottom die 1801 in FIG. 18. Similarly, sense-die 66 in FIG. 6 and die 714 in FIG. 7 may be top die 1802 in FIG. 18. Since photo-die needs to have continuous array of photodiodes, balls are formed on the surface of the photo-die. V grooves are formed at the four corners for the sense-die. Referring to FIG. 7, this scheme allows sense-die contacts 79 to align perfectly to the contacts 710 on the photo-die. Smallest individual contact size on the contact arrays 79 and 710 in FIG. 7 may be, for example, 6 microns by 6 micron corresponding to smallest 3D pixel pitch. Balls 1710 and grooves 1711 in FIG. 17 may be formed with sub-micron accuracy. Therefore contacts 79 and 710 in FIG. 7 may be self-aligned to each other with sub-micron accuracy.

Figure 19:
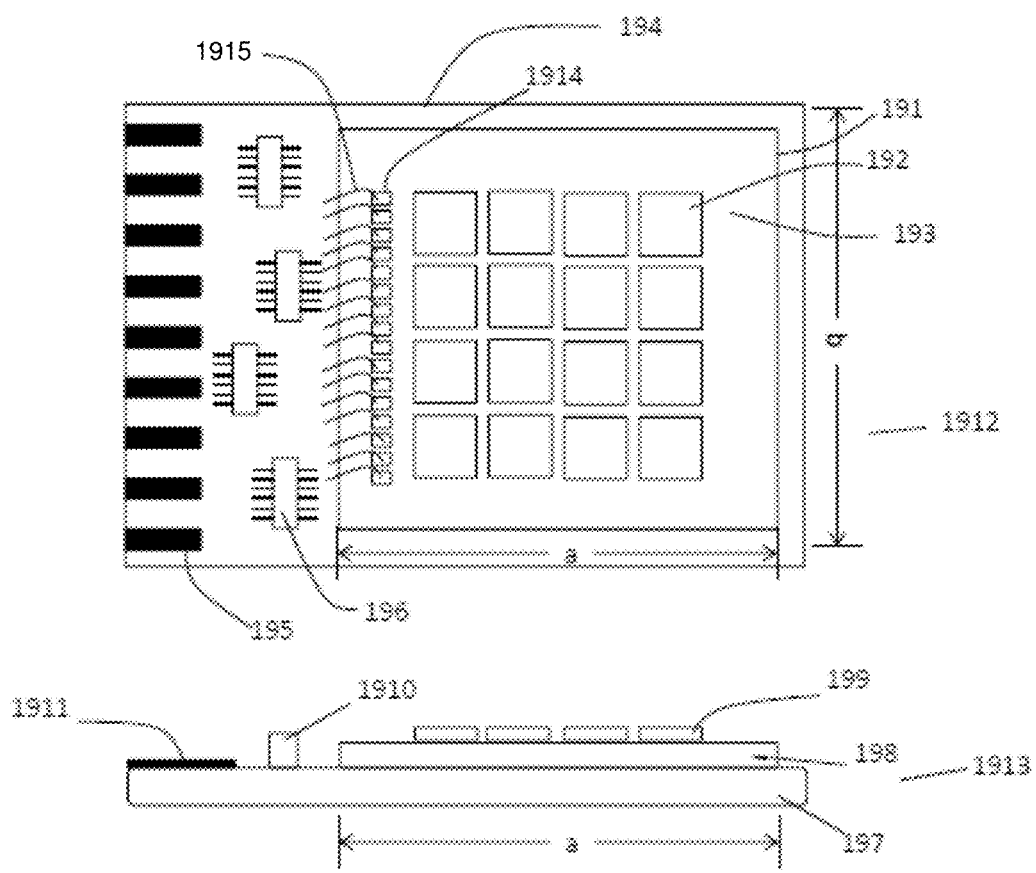
FIG. 19 shows packaged X-ray sensor.

FIG. 19 shows packaged X-ray sensor. The top view 1912 and cross-sectional view 1913 of finished package of the X-ray detector are shown in FIG. 19. The assembly includes board edge connectors 195 (top view), 1911 (cross-sectional view) that are connected to a computer to perform image processing. The assembled 3D pixel array 191, made with photo-die 193 (top view), 198 (cross-sectional view) and sense-dies 192 (top view), 199 (cross-sectional view), is bonded to substrate 194 (top view), 197 (cross-sectional view). Input/output (I/O) pads 1914 are connected to the metal pads (not shown for simplicity) on the substrate by bonding wires 1915. Additional chips 196 (top view), 1910 (cross-sectional view) are bonded to the substrate 194 (top view), 197 (cross-sectional view) to perform most of the signal processing prior to sending stream data to computer for image processing. Largest dimensions (a×b in FIG. 19) possible on a 12-inch wafer are 20 cm×20 cm. The total number of pixels possible on such an imager made by using the present disclosure is more than 1 billion corresponding to 6 micron 3D pixel pitch. The best that has been done in the industry today is 10 million pixels on an imager made with TFT technology.

Figure 20:
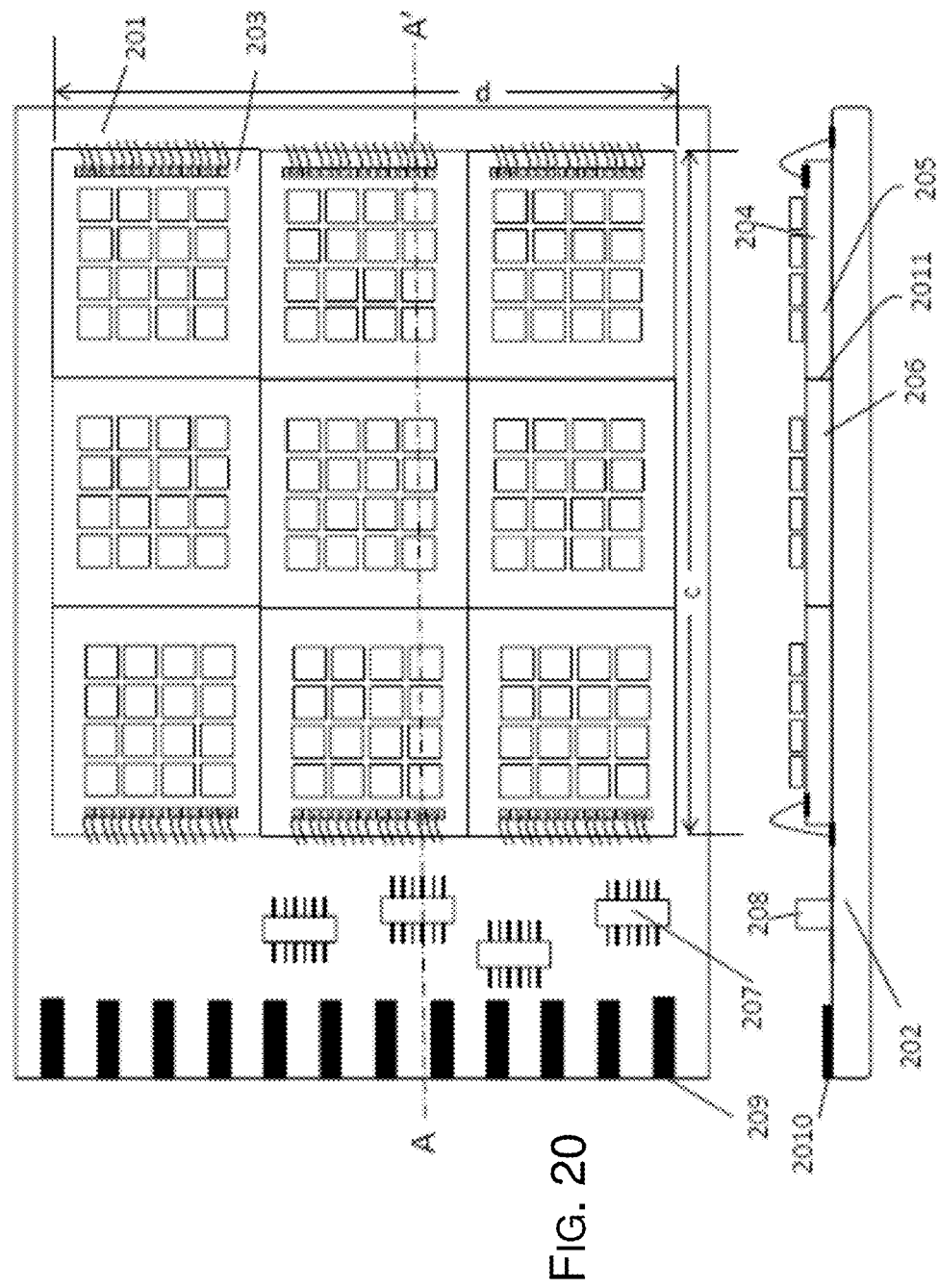
FIG. 20 shows packaged tiled X-ray sensor.
Figure 21:
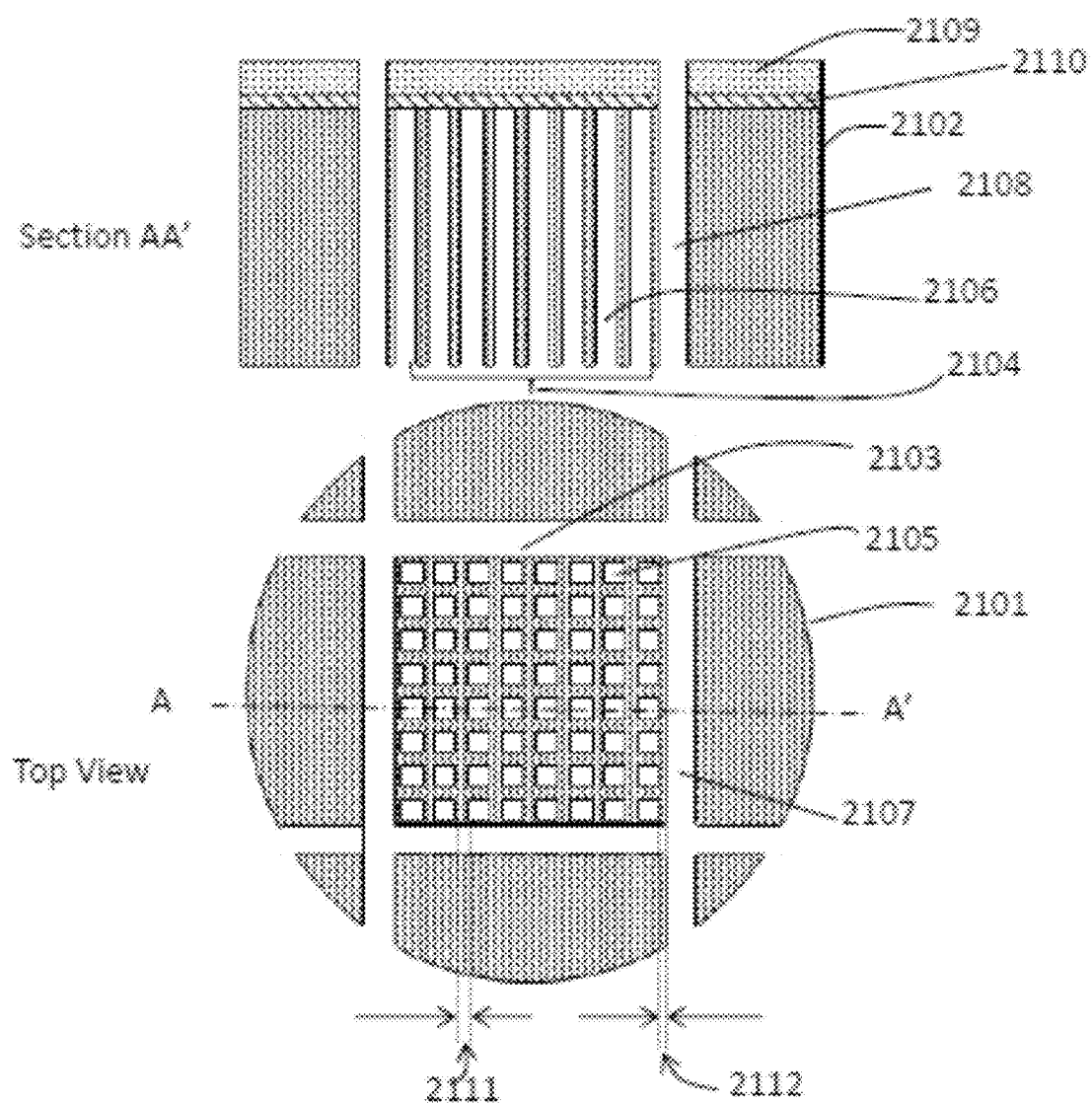
FIG. 21 shows sectional view and top view of a wafer during cutting wafer to make a square shape with precise and smooth vertical edges for precise butting.
Figure 22:
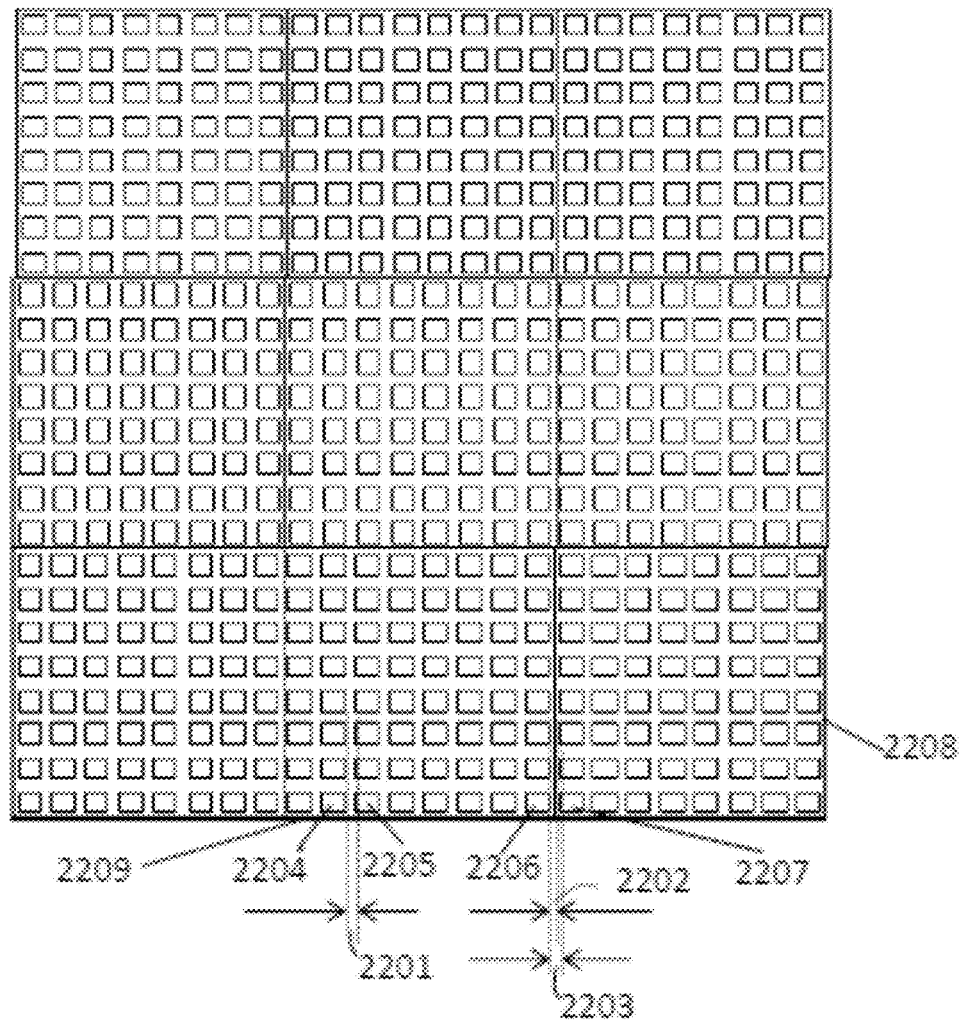
FIG. 22 shows details of tiling.

The present disclosure also provides a method of four sided tiling to make a very large detector. FIG. 20 shows packaged tiled X-ray sensor. FIG. 21 shows sectional view and top view of a wafer during cutting wafer to make a square shape with precise and smooth vertical edges for precise butting. FIG. 22 shows details of tiling. An assembly and package with nine tiles is shown in FIG. 20 to make 60 cm×60 cm detector by using 20 cm×20 cm tile described earlier made from a 12-inch wafer. Nine integrated dies 203 (top view), 204 (cross-sectional view) with photo-die and sense-dies are placed on the substrate 201 (top view), 202 (cross-sectional view) and are butted against each other. The assembly includes board edge connectors 209 (top view), 2010 (cross-sectional view) that are connected to a computer to perform image processing. Additional chips 207 (top view), 208 (cross-sectional view) are bonded to the substrate 201 (top view), 202 (cross-sectional view) to perform most of the signal processing prior to sending stream data to computer for image processing. The edges 2011 of dies 206 and 205 in the cross-sectional view as shown in FIG. 20 are perfectly vertical. Method of making edges 2011, as shown in FIG. 20, perfectly vertical is described with reference to FIG. 21. Referring to FIG. 21, an array of grid holes 2103 (top view), 2104 (cross-sectional view) is etched in the wafer 2101 (top view), 2102 (cross-sectional view) as described earlier regarding FIG. 13. The scribe line window 2107 (top view), 2108 (cross-sectional view) is defined and etched at the same time when grid holes 2105 (top view), 2106 (cross-sectional view) of the array 2103, 2104 are etched as shown in FIG. 21. At the end of wafer fabrication process the grid array 2103, 2104 is blocked by the photoresist. Next, by using anisotropic plasma etch process, the layer of oxide 2110 and epitaxial silicon 2109 are removed so as to separate photo-die 2103 from the wafer 2101. Since anisotropic plasma etching was used, side wall in the scribe line window 2107, 2108 will be perfectly vertical. Moreover, given that state of the art photolithography is used, the space 2112 between the edge of the die and the edge of the last photodiode will be exactly half of the space 2111 between two adjacent photodiodes. Thus, referring to FIG. 22, when two photo-dies 2208, 2209 are tiled by butting the next to each other, the space 2203 between two end diodes 2206, 2207 will be the same as the space 2201 between two adjacent photodiodes 2204, 2205 in a photo-die. The space 2202 between end diode 2206 and edge of photo-die 2209 may be half of that of space 2203 and space 2201. Hence the whole array of the photodiodes in nine tiles as shown in FIG. 22 will be continuous so the X-ray images displayed on a monitor will be continuous without a seam.

Figure 23:
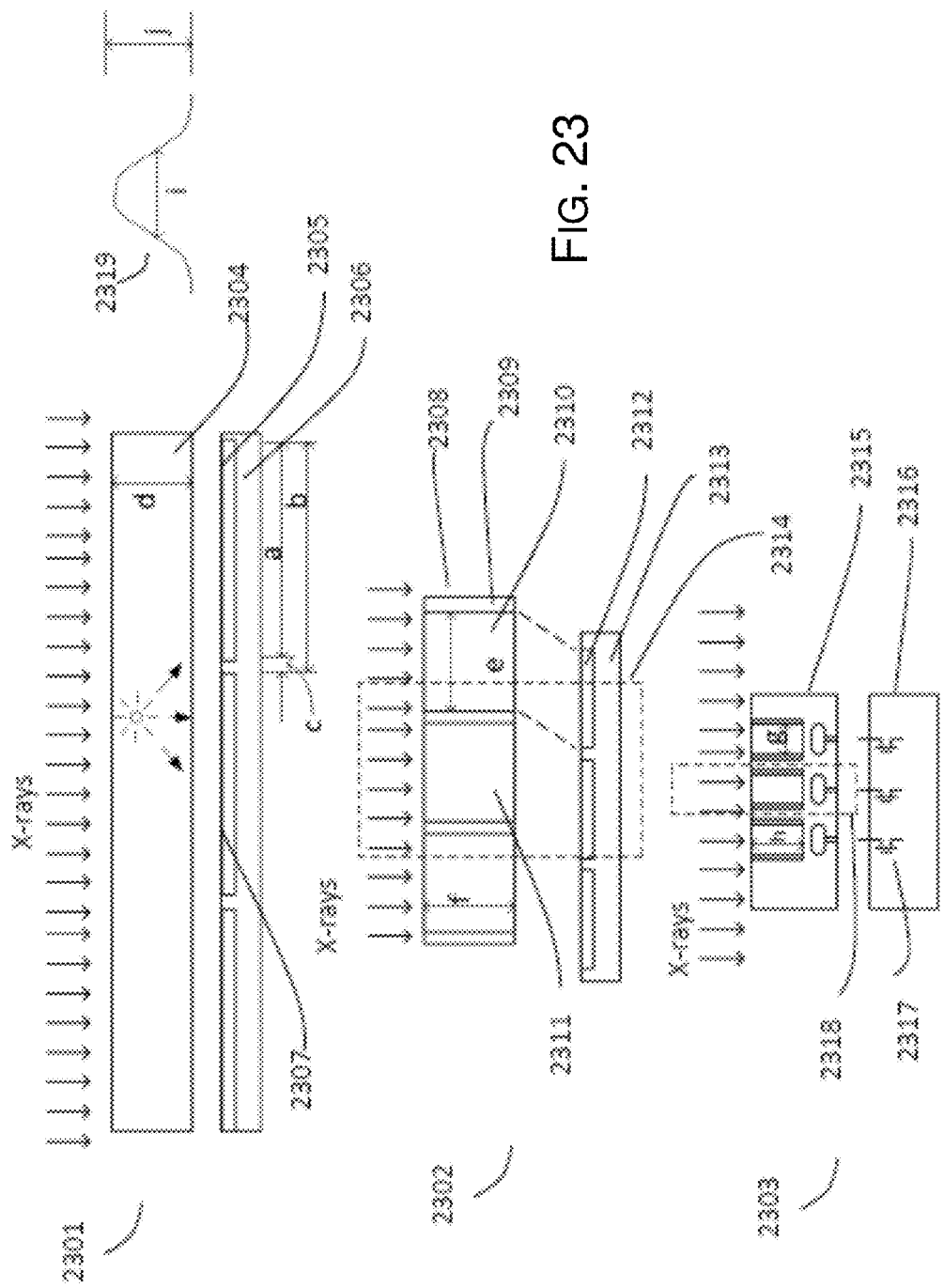
FIG. 23 shows details of operation of the X-ray sensor of the present disclosure.

FIG. 23 shows details of operation of the X-ray sensor of the present disclosure. One CMOS detector 2301 according to an existing approach is shown in FIG. 23. On a silicon substrate 2306, active pixels 2305 and 2307 may contain photodiode and sense and select transistors. A scintillator film 2304 with thickness 'd' is placed on the substrate 2306. Beams of X-ray are incident on the scintillator film 2304 and generate visible light photons which are sensed by active pixels 2305 and 2307. Light 2319 spreads in the scintillator film 2304 sideways and creates optical noise, thereby reducing contrast or modular transfer function (MTF).

Figure 24:
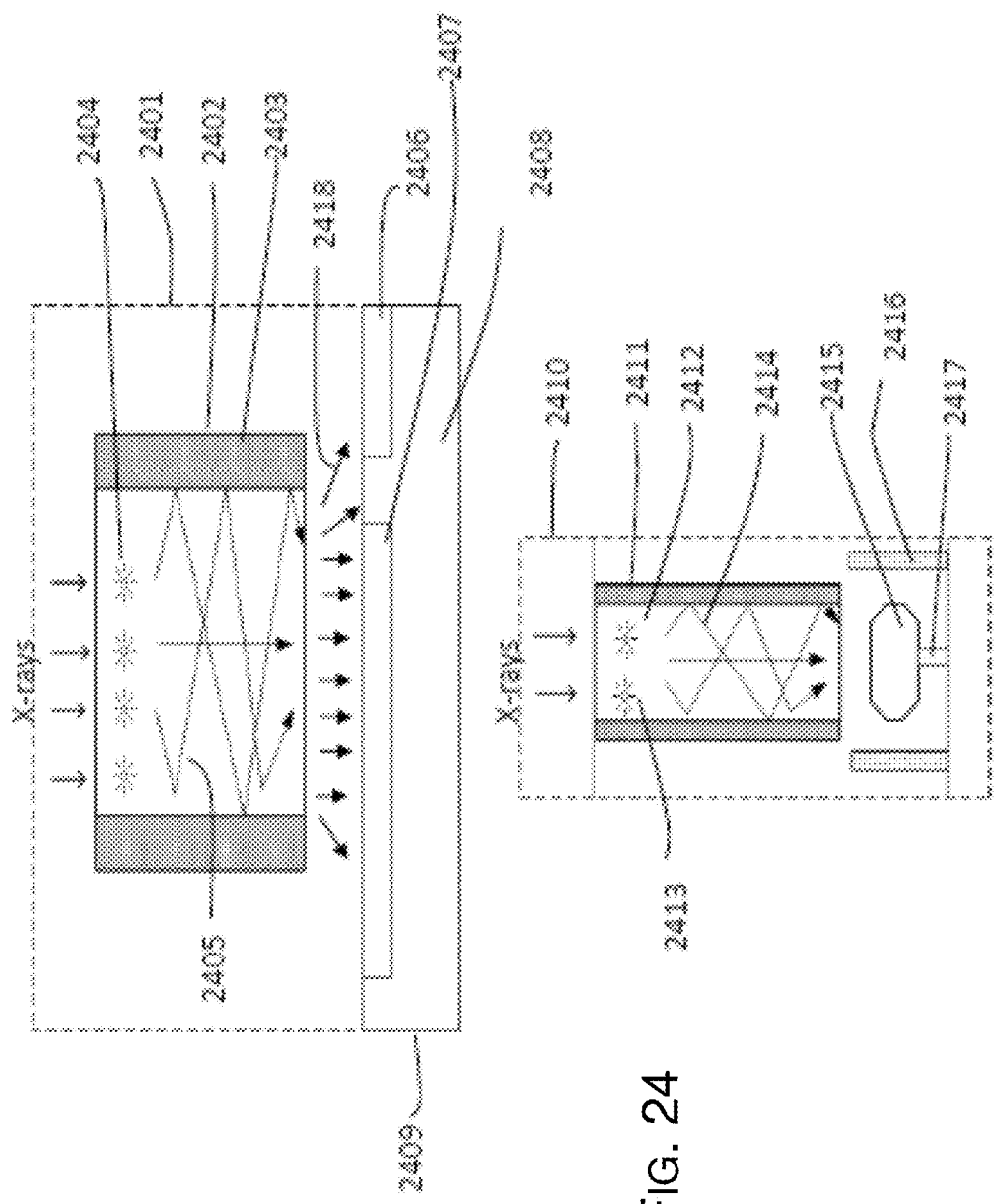
FIG. 24 shows details of scintillator and optical waveguide with self-aligned photodiode.

According to one existing approach, a grid 2308 in an X-ray system 2302 acts like a optical waveguide to prevent spreading of light 2319 to improve optical noise and hence contrast. When grid 2308, having grid holes 2310 separated from each other by sidewalls 2309 and filled with scintillator 2311, is placed on the CMOS detector 2313 a lot of light can be leaked to adjacent pixel due to misalignment of grid hole 2310 to the active pixel 2312. Hence, a lot of sensitivity and contrast or MTF 15 reduced. The dotted-line enclosure 2314 is enlarged in FIG. 24 for more detailed understanding of the effect. Referring to FIG. 24, beams of X-ray incident on the scintillator 2404 of photo-die 2401 generates light which is reflected to become reflected light 2405 by layer 2403 of grid hole 2402. Additionally, on CMOS substrate 2408, light 2418 from grid hole 2402 is incident on the detector 2409 intended for pixel 2407. However, due to misalignment some of the light 2418 is leaked to pixel 2406, thereby creating optical noise in that pixel and hence reducing contrast or MTF.

Referring to FIG. 23, the scheme 2303 in accordance with the present disclosure eliminates this problem of noise due to spreading of light in adjacent pixels. Beams of X-ray are incident on the grid hole with scintillator and are converted to light photons. Due to self-alignment of photodiode to the grid hole, no leakage of light takes place in scheme 2303. Scheme 2303 shows a photo-die 2315 aligned with a sense-die 2316 which includes a number of sense-transistors 2317. The dotted-line enclosure 2318 in FIG. 23 is enlarged in FIG. 24. Referring to FIG. 24, beams of X-ray 2410 incident on the scintillator 2413 generate light that stays in the optical waveguide 2412. Light stays in the waveguide 2412 because of total internal reflection due to difference on the indexes of refraction between layer 2411 and scintillator 2413. An alternative embodiment is to use a reflective material for layer 2411. It will also create waveguide for light by reflections at walls. Reflected light 2414 is incident on the self-aligned diode 2415 and there is no leakage of light to adjacent photodiode(s). Next, electron-hole pairs are generate by light photons in the diode 2415 which are converted to charge at contact 2417 to be detected by the sense-transistors 2317 in sense-die 2316 as shown in FIG. 23. Referring to FIG. 24, layer 2416 made of p+ impurities will block any electron from going to adjacent pixel. An alternative embodiment is that layer 2416 is trench oxide if pixel size is very small. Trench oxide provides two advantages. Firstly it will block electrons from going to next pixel. Secondly trench oxide will block any infrared light from going to next pixels due to difference in refractive indexes and causing total internal reflection.

The foregoing embodiment and various implementations thereof provide a plethora of benefits. First, a large size of 20 cm×20 cm per tile can be achieved. Second, small pixel size of 6 micron and below is feasible, hence very high resolution of 80 lp/mm or higher of the detector can be achieved. Third, high pixel density of 1 giga-pixel per tile can be achieved. Fourth, scalability to very large size for seamless tiling is achievable. Fifth, the yield of assembly of 3D pixel array can be nearly 100% since sense-dies containing transistors are very small and high yielding. Photodie is high yielding because it has no transistor. With known good dies, the sense-dies and photo-dies can be placed tested, bonded one at a time. Moreover, low noise, high contrast or MTF, and high DQE can be achieved due to a number of factors, including: no spreading of light in the grid, high resolution and low noise; no spreading of light at the interface of grid and photodiode array to achieve further higher resolution and low noise; no crosstalk of electrons; isolated photodiode well; very small electronic or circuit noise; small wire distances; all signal processing on the photon counting for such large arrays because more than several hundreds of transistor per pixel can be integrated as sense-die is separate from photo-die; very high speed of CMOS circuits enabling very fast extraction of signals, higher speed and low noise enabling very short exposure time, fast data extraction and photon counting to increase sensitivity to X-rays.

The table below shows comparison of prior art CMOS X-ray detectors and a detector in accordance with the present disclosure.

| | Prior Art Flat Screen Scintillator on 2D Pixel Array Sensor | Prior Art Scintillator Grid on 2D Pixel Array Sensor | Present Disclosure 3D Pixel Array with Structured scintillator with integrated photo sensor. |
|---|---|---|---|
| Smallest Pixel Pitch on silicon | 100 | 50 | 6 |
| Typical Scintillator thickness | 300 | 300 | 800 |
| Resolution in line pair per mm or lp/mm | 2.5 | 5 | 80 |
| Optical cross-talk | Very high | High | Very low. |
| Dose per image | Very high | High | Low for analog and Very Low for photon counting |

Example Second Embodiment

Figure 25:
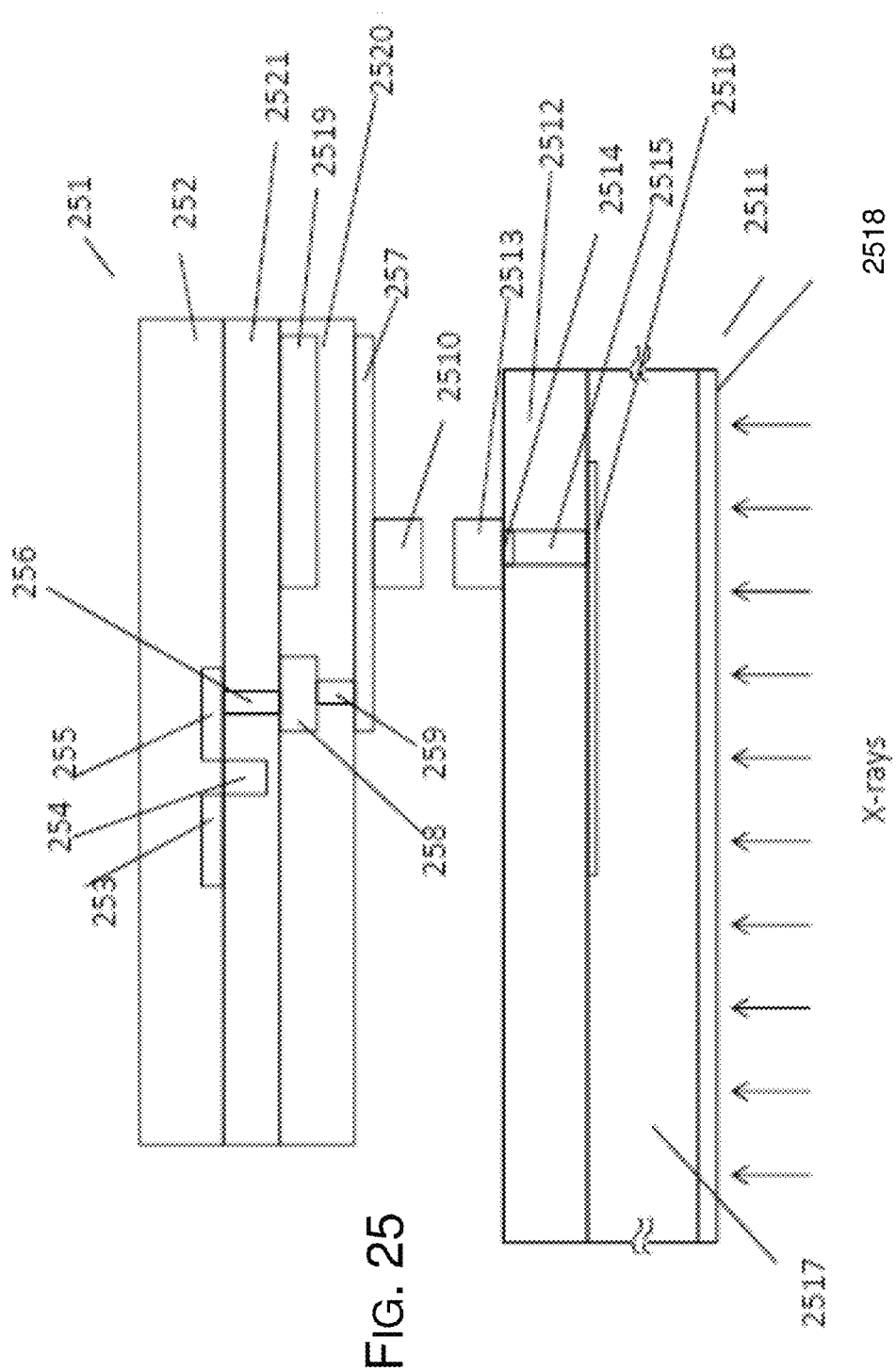
FIG. 25 shows structure for direct X-ray sensor.

FIG. 25 shows structure for direct X-ray sensor according to a second embodiment of the present disclosure. The silicon wafer with photodiodes and grid holes filled with scintillator as shown in FIG. 5A is replaced by a direct sensing substrate 2511 in FIG. 25. The substrate 2511 includes a photoconductor 2517 with common electrode 2518 and a pixel electrode 2516. The pixel electrode 2516 is connected to top contact 2513 through a stack of metal layers 2515 and 2514 inside insulator 2512. Beams of X-ray are converted to electrons and holes, or electron-hole pairs, as photons collide with atoms of photoconductor 2517 such as selenium, CdTe, silicon and X-ray collection pixels. An electric field is applied across photoconductor 2517 by biasing electrodes 2518 and 2516. The common electrode 2518 is biased at a fixed voltage.

FIG. 25 also shows a sense chip 251. In particular, contact 2510 is connected to a MOS transistor in the silicon substrate 252 with source 255, drain 253 and gate 254 in the sense chip 251. The source 255 of the MOS transistor is connected to first electrode 257 of a capacitor through metal layers 256, 258 and 259 through insulator layers 2521 and 2520 using state of the art silicon wafer fabrication technology. A second electrode 2519 and the first electrode 257 form a sensing capacitor. The X-ray collection pixels may be constructed in a large array as big as desired on a substrate made with materials such as quartz, silicon, ceramic, plastic or any other material where fine holes can be drilled and metal layer can be deposited. An array of sense-pixels may be fabricated with CMOS technology. Size of the sense chip may be around one square centimeter (cm$^2$). Size of the collection pixel array may be 40 cm×40 cm or higher containing several giga-pixels. Each sense chip 251 may address one block of collection pixels when contact 2510 is aligned and bonded to contact 2513 of collection pixel to form 3D pixels. Each sense chip may address several hundred-million collection pixels in a block in the substrate containing them. Alignment of the sense chip 251 to collection pixel block on the collection substrate 2511 may be done in accordance with U.S. Pat. No. 7,745,301.

In operation, the contact 2510 is connected to contact 2513 to form a 3D pixel as shown in FIG. 25. Beams of X-ray are converted to hole-electron pairs in the photoconductor 2517 (herein interchangeably referred to as region 2517 or layer 2517) and collected by the pixel electrode 2516 (herein interchangeably referred to as region 2516 or layer 2516) when enough electric field is created by applying bias to electrodes 2518 and 2516. The pixel electrode 2516 is set at zero voltage prior to floating it by turning off MOS transistor including drain 253, gate 254 and source 255 in sense chip 251. The electrode 2519 of the capacitor in the sense chip 251 is also grounded. Electrons will charge the electrode 2516 to a potential, or voltage, to a value depending on the amount of X-ray exposure. The voltage is sensed by the MOS transistor constructed of drain 253, gate 254 and source 255 and supporting circuits (similar to pixel addressing circuits 76) in the sense chip 251. The electrode 257 is reset to zero volt for a subsequent cycle of the operation through the MOS transistor.

With the second embodiment as described above, it is possible to make very large 3D pixel array on a very large detector panel with very small pixel size for direct sensing of X-rays.

The photoconductor 2517 may be single-crystal semiconductor such as silicon, CdTe, etc. Pixel electrode 2516 in FIG. 25 may be an implanted n region, and region 2516 may be implanted with dopants of n-type dopants to form PN diode. This PN diode may be reverse biased with common electrode 1518 (herein interchangeably referred to as region 2518 or layer 2518) to create a wide depletion layer near region 2516.

In operation, initially the photodiode is charged with a voltage, and n region is kept floating. Beams of X-ray incident on the photoconductor will generate electrons and discharge the n region proportional to the intensity of X-ray. Sense chip 251 will sense the voltage at the n region 2516.

In some embodiments, the polarity of doping in the semiconductor substrate needs to be changed appropriately. For example, a Schottky diode may be formed in the photoconductor 2517 by placing a metal in pixel electrode 2516 such as platinum. Pixel electrode 2516 may be precharged. Beams of X-ray incident on the photoconductor will generate electrons and discharge the pixel electrode 2516 proportional to the intensity of X-ray. Sense chip 251 will sense the voltage in the n region 2516.

Example Third Embodiment

Figure 26:
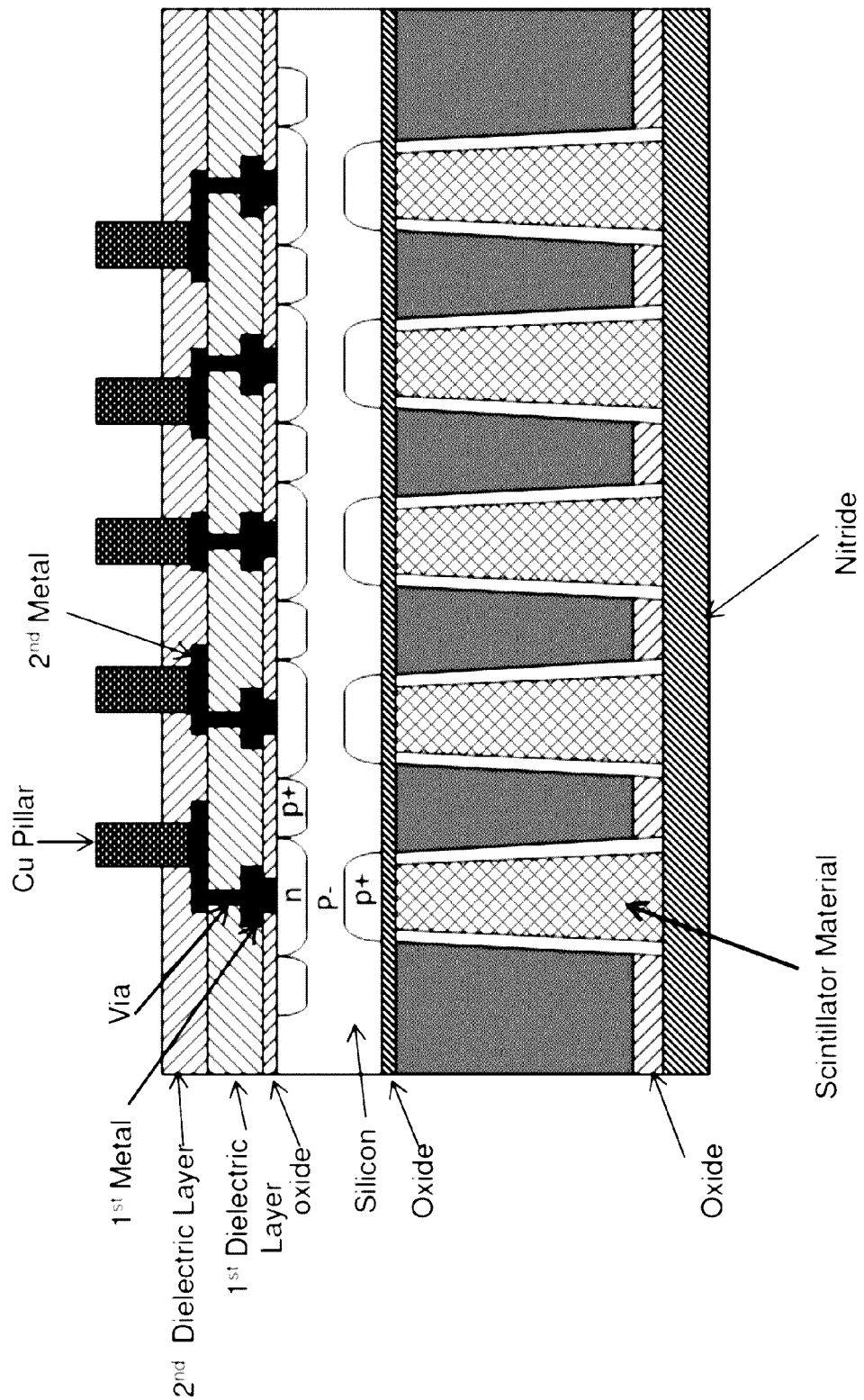
FIG. 26 shows alternate method of making a structure for photo-die of FIG. 5A.

FIG. 26 illustrates yet another way of constructing a structure of photo-die 52 of FIG. 5A. An example process flow of fabricating the structure of FIG. 26 involves a number of the operations, including: SOI wafer with p−epitaxy, oxide growth, p well mask, p well/p+ implant and anneal, n well mask, n well/n+ implant and anneal, contact mask, tungsten silicide, first metal deposition (e.g., tungsten), first dielectric deposition, second metal deposition (e.g., tungsten), second dielectric deposition, pad making, grid hole making, grid hole plasma etch, CVD oxide on sidewalls, CsI filling, CsI melting, and sealing grid holes with Cu pillars.

The metal layers in the above-described process may be made of tungsten instead of aluminum, which is traditionally used. In some embodiments, tungsten silicide is formed at 1000° C. in contact holes followed by tungsten, which forms the interconnect layer on the photo-die. Advantage of this scheme is that grid hole etching is the last step in a CMOS foundry. Thus, when scintillator is annealed at 680° C., temperature does affect contact metallurgy.

Highlights of Features

In view of the above, features of various embodiments of the present disclosure are highlighted below.

In one aspect, an indirect X-ray sensor may include a silicon wafer having a front side and a back side opposite the front side. The silicon wafer may include an array of photodiodes thereon with each of the photodiodes having a contact on the front side of the silicon wafer and self-aligned with a respective grid hole of an array of grid holes that are on the back side of the silicon wafer. Each of the grid holes may be filled with a scintillator configured to convert beams of X-ray into light. The indirect X-ray sensor may also include one or more silicon dies with an array of photo-sensing circuits. Each of the photo-sensing circuits may include a contact at a top surface of the one or more silicon dies. The contact on each of the photodiodes may be aligned and bonded to the contact of a respective photo-sensing circuit of the array of photo-sensing circuits of the one or more silicon dies. Light converted from beams of X-ray by the scintillators within the grid holes is converted into electron-hole pairs by the photodiodes altering a voltage across the photodiodes. The voltage may be sensed by the photo-sensing circuits through the contacts on the photodiodes and the contacts on the photo-sensing circuits.

In some embodiments, the silicon wafer may include a SOI wafer.

In some embodiments, the grid holes on the back side of the SOI wafer may reach an insulator of the SOI wafer.

In some embodiments, PN diodes may be formed below an insulator of the SOI wafer with impurities of n type or p type. The PN diodes may be aligned to sidewalls of the grid holes.

In some embodiments, the PN diodes may be electrically connected to the contacts on the front side of the SOI wafer through multilevel metal interconnect.

In some embodiments, light sensed by the PN diodes and charge proportional to exposed radiation on the back side of the SOI wafer may appear at the contacts on the front side of the SOI wafer.

In some embodiments, sidewalls of the grid holes may be coated with a thin layer of oxide, a thin layer of nitride, a thin layer of silicon dioxide or metal, or a combination thereof.

In some embodiments, the thin layer of metal may include aluminum or chrome.

In some embodiments, the grid holes may be covered by an insulator, and sidewalls of the grid holes may be coated with an insulator stack with a dielectric constant such that light remains in the grid holes due to total internal reflection.

In some embodiments, the contacts of the array of photodiodes on the silicon wafer may have a first pitch. The contacts of the array of photo-sensing circuits on the one or more silicon dies may have a second pitch smaller than the first pitch. The contacts of the array of photodiodes on the silicon wafer and the contacts of the array of photo-sensing circuits on the one or more silicon dies may be bonded together face to face with the first pitch reduced using multilevel metal interconnects.

In one aspect, a method of fabricating an indirect X-ray sensor may include: providing a silicon wafer having a front side and a back side opposite the front side; forming an array of grid holes on the back side of the silicon wafer; forming an array of photodiodes on the front side of the silicon wafer with each of the photodiodes having a contact on the front side of the silicon wafer and self-aligned with a respective grid hole of the array of grid holes; filling each of the grid holes with a scintillator configured to convert beams of X-ray into light; forming one or more silicon dies with an array of photo-sensing circuits, each of the photo-sensing circuits having a contact at a top surface of the one or more silicon dies; and aligning and bonding the contact on each of the photodiodes to the contact of a respective photo-sensing circuit of the array of photo-sensing circuits of the one or more silicon dies. Light converted from beams of X-ray by the scintillators within the grid holes is converted into electron-hole pairs by the photodiodes altering a voltage across the photodiodes. The voltage may be sensed by the photo-sensing circuits through the contacts on the photodiodes and the contacts on the photo-sensing circuits.

In some embodiments, the silicon wafer may include a SOI wafer.

In some embodiments, the grid holes on the back side of the SOI wafer may reach an insulator of the SOI wafer.

In some embodiments, the method may further include forming PN diodes below an insulator of the SOI wafer with impurities of n type or p type such that the PN diodes are aligned to sidewalls of the grid holes.

In some embodiments, the PN diodes may be electrically connected to the contacts on the front side of the SOI wafer through multilevel metal interconnect.

In some embodiments, the scintillator may include CsI.

In some embodiments, the method may further include coating sidewalls of the grid holes with a thin layer of oxide, a thin layer of nitride, a thin layer of silicon dioxide or metal, or a combination thereof.

In some embodiments, the thin layer of metal may include aluminum or chrome.

In some embodiments, the method may further include: covering the grid holes with an insulator; and coating sidewalls of the grid holes with an insulator stack with a dielectric constant such that light remains in the grid holes due to total internal reflection.

In some embodiments, the method may further include: scribing the silicon wafer in a square or rectangular shape by applying photoresist to form first and second tiles; placing and aligning a mask to the contacts on the front side of the silicon wafer with a precision of less than 1 micron; anisotropic or vertical plasma etching the silicon wafer with no undercut; plasma etching oxide and remaining layer of silicon of the silicon wafer with no undercut; tiling the first tile and the second tile by: placing the first tile next to the second tile with the first and second tiles butted against each other, and placing a straight edge against the first and second tiles so that two corners of butting edges of the first and second tiles are self-aligned; and optionally tiling additional tiles to provide an array of a predefined size. This process of tiling may continue until desired array size is reached. Precision of the photolithography and precision etching of wafer enables precise pitch of the two photodiodes to be maintained. Each nearest to the edge of the tile may be the same as the pitch of the photodiodes inside the tile made from silicon wafer.

In one aspect, a method of constructing a photo-die of an X-ray sensor may include: forming an oxide layer on a first side of a silicon wafer; forming an array of grid holes on a second side of the silicon wafer opposite the first side thereof; filling the grid holes with an oxide; forming an array of photodiodes on the first side of the silicon wafer by implanting the first side of the silicon wafer with p-type impurities and n-type impurities such that each photodiode of the array of photodiodes is aligned with a respective grid hole of the array grid holes; depositing a thin nitride layer on the first side of the silicon wafer; removing the oxide in the grid holes; coating sidewalls of the grid holes with an insulator stack; filling the grid holes with a scintillator material; heating the silicon wafer to crystallize the scintillator material; forming a multilevel metal stack over the photodiodes on the first side of the silicon wafer; and forming a plurality of metal pillars that are electrically connected to the photodiodes through the multilevel metal stack.

In some embodiments, the scintillator material may include CsI.

In some embodiments, the method may further include etching the oxide layer using anisotropic oxide plasma etch with little or no undercut.

In some embodiments, the method may further include etching the silicon wafer, which is a SOI wafer, such that the grid holes reach a buried oxide of the SOI wafer.

In some embodiments, the method may further include: heavily doping the silicon wafer with p dopants to isolate the photodiodes from each other; and heavily doping the silicon wafer with n dopants to electrically connect an n region of each of the photodiodes to metal contacts in the multilevel metal stack.

In some embodiments, the method may further include coating sidewalls of the grid holes with a thin layer of oxide, a thin layer of nitride, a thin layer of silicon dioxide or metal, or a combination thereof.

In some embodiments, the thin layer of metal may include aluminum or chrome.

In some embodiments, the method may further include: aligning n+ implant regions of the photodiodes to perimeters of the grid holes; and aligning one or more masks to the n+ implant regions.

In some embodiments, the method may further include: aligning two or more alignment patterns to the grid holes using photolithography on the second side of the silicon wafer; and anisotropically etching the two or more alignment patterns through the silicon wafer from the second side thereof.

In some embodiments, forming the multilevel metal stack may include: forming a plurality of first contact holes on the first side of the silicon wafer; filling the first contact holes with metal; forming first metal contacts to cover the first contact holes; depositing a layer of insulator on the first metal contacts; forming a plurality of second contact holes in the layer of insulator; filling the second contact holes with metal; and forming second metal contacts to cover the second contact holes.

In one aspect, an indirect X-ray sensor may include a silicon wafer having a front side and a back side opposite the front side. The silicon wafer may include an array of pixels on the front side of the silicon wafer. Each of the pixels may include a photodiode and a photo-sensing circuit. The silicon wafer may also include an array of grid holes on the back side of the silicon wafer. Each of the grid holes may be self-aligned with a respective photodiode of a respective pixel of the array of pixels. Each of the grid holes may be filled with a scintillator or a material that converts X-ray into light. Beams of X-ray incident on the back side of the silicon wafer are converted into light by the scintillators. The light is converted into electron-hole pairs by the photodiodes of the array of pixels altering a charge across the photodiodes. A value of the altered charge may be proportional to an X-ray intensity sensed by the respective photo-sensing circuit of each pixel.

In some embodiments, the silicon wafer may include a SOI wafer.

In some embodiments, the grid holes on the back side of the SOI wafer may reach an insulator of the SOI wafer.

In some embodiments, PN diodes may be formed below an insulator of the SOI wafer with impurities of n type or p type. The PN diodes may be aligned to sidewalls of the grid holes.

In some embodiments, the PN diodes may be electrically connected to the contacts on the front side of the SOI wafer through multilevel metal interconnect.

In some embodiments, light sensed by the PN diodes and charge proportional to exposed radiation on the back side of the SOI wafer may appear at the contacts on the front side of the SOI wafer.

In some embodiments, sidewalls of the grid holes may be coated with a thin layer of oxide, a thin layer of nitride, a thin layer of silicon dioxide or metal, or a combination thereof.

In some embodiments, the thin layer of metal may include aluminum or chrome.

In some embodiments, the grid holes may be covered by an insulator. Sidewalls of the grid holes may be coated with an insulator stack with a dielectric constant such that light remains in the grid holes due to total internal reflection.

In some embodiments, the scintillator may include CsI.

In one aspect, a method of fabricating an indirect X-ray sensor may include: providing a silicon wafer having a front side and a back side opposite the front side; forming an array of pixels on the front side of the silicon wafer, each of the pixels comprising a photodiode and a photo-sensing circuit; forming an array of grid holes on the back side of the silicon wafer, each of the grid holes self-aligned with a respective photodiode of a respective pixel of the array of pixels; and filling each of the grid holes with a scintillator or a material that converts X-ray into light. Beams of X-ray incident on the back side of the silicon wafer are converted into light by the scintillators. The light is converted into electron-hole pairs by the photodiodes of the array of pixels altering a charge across the photodiodes. A value of the altered charge may be proportional to an X-ray intensity sensed by the respective photo-sensing circuit of each pixel.

In some embodiments, the silicon wafer may include a SOI wafer.

In some embodiments, the grid holes on the back side of the SOI wafer may reach an insulator of the SOI wafer.

In some embodiments, the method may further include forming PN diodes below an insulator of the SOI wafer with impurities of n type or p type such that the PN diodes are aligned to sidewalls of the grid holes.

In some embodiments, the PN diodes may be electrically connected to the contacts on the front side of the SOI wafer through multilevel metal interconnect.

In some embodiments, the scintillator may include CsI.

In some embodiments, the method may further include coating sidewalls of the grid holes with a thin layer of oxide, a thin layer of nitride, a thin layer of silicon dioxide or metal, or a combination thereof.

In some embodiments, the thin layer of metal may include aluminum or chrome.

In some embodiments, the method may further include: covering the grid holes with an insulator; and coating sidewalls of the grid holes with an insulator stack with a dielectric constant such that light remains in the grid holes due to total internal reflection.

In some embodiments, the method may further include: scribing the silicon wafer in a square or rectangular shape by applying photoresist to form first and second tiles; placing and aligning a mask to the contacts on the front side of the silicon wafer with a precision of less than 1 micron; anisotropic or vertical plasma etching the silicon wafer with no undercut; plasma etching oxide and remaining layer of silicon of the silicon wafer with no undercut; placing the first tile next to the second tile with the first and second tiles butted against each other; and placing a straight edge against the first and second tiles so that two corners of butting edges of the first and second tiles are self-aligned.

In one aspect, an optical sensor may include a silicon wafer having a front side and a back side opposite the front side. The silicon wafer may include an array of photodiodes each of which having a contact on the front of the silicon wafer. The silicon wafer may also include an array of grid holes on the back side thereof. Each of the grid holes may be self-aligned with a respective photodiode of the array of photodiodes and filled with a transparent material having a refractive index sufficient for total internal reflection of light in the respective grid hole. The optical sensor may also include one or more silicon dies with an array of photo-sensing circuits each of which having a contact at a top surface of the one or more silicon dies. The contact on each of the photodiodes may be aligned and bonded to the contact of a respective photo-sensing circuit of the array of photo-sensing circuits of the one or more silicon dies. Incident light in the grid holes on the back side of the silicon wafer is converted into electron-hole pairs by the photodiodes altering a voltage across the photodiode. The voltage may be sensed by the photo-sensing circuits of the one or more silicon dies through the contacts on the photodiodes and the contacts on the photo-sensing circuits of the one or more silicon dies.

In some embodiments, the silicon wafer may include a SOI wafer.

In some embodiments, the grid holes on the back side of the SOI wafer may reach an insulator of the SOI wafer.

In some embodiments, PN diodes may be formed below an insulator of the SOI wafer with impurities of n type or p type. The PN diodes may be aligned to sidewalls of the grid holes.

In some embodiments, the PN diodes may be electrically connected to the contacts on the front side of the SOI wafer through multilevel metal interconnect.

In some embodiments, light sensed by the PN diodes and charge proportional to exposed radiation on the back side of the SOI wafer may appear at the contacts on the front side of the SOI wafer.

In some embodiments, sidewalls of the grid holes may be coated with a thin layer of oxide, a thin layer of nitride, a thin layer of silicon dioxide or metal, or a combination thereof.

In some embodiments, the thin layer of metal may include aluminum or chrome.

In some embodiments, the grid holes may be covered by an insulator. Sidewalls of the grid holes may be coated with an insulator stack with a dielectric constant such that light remains in the grid holes due to total internal reflection.

In some embodiments, the contacts of the array of photodiodes on the silicon wafer may have a first pitch. The contacts of the array of photo-sensing circuits on the one or more silicon dies may have a second pitch smaller than the first pitch. The contacts of the array of photodiodes on the silicon wafer and the contacts of the array of photo-sensing circuits on the one or more silicon dies may be bonded together face to face with the first pitch reduced using multilevel metal interconnects.

In one aspect, a method of fabricating an optical sensor may include: providing a silicon wafer having a front side and a back side opposite the front side; forming, on the front side of the silicon wafer, an array of photodiodes each of which having a contact on the front of the silicon wafer; forming, on the back side of the silicon wafer, an array of grid holes each of which self-aligned with a respective photodiode of the array of photodiodes; filling each of the grid holes with a transparent material having a refractive index sufficient for total internal reflection of light in the respective grid hole; and forming, on one or more silicon dies, an array of photo-sensing circuits each of which having a contact at a top surface of the one or more silicon dies. The contact on each of the photodiodes may be aligned and bonded to the contact of a respective photo-sensing circuit of the array of photo-sensing circuits of the one or more silicon dies. Incident light in the grid holes on the back side of the silicon wafer is converted into electron-hole pairs by the photodiodes altering a voltage across the photodiode. The voltage may be sensed by the photo-sensing circuits of the one or more silicon dies through the contacts on the photodiodes and the contacts on the photo-sensing circuits of the one or more silicon dies.

In some embodiments, the silicon wafer may include a SOI wafer.

In some embodiments, the grid holes on the back side of the SOI wafer may reach an insulator of the SOI wafer.

In some embodiments, the method may further include forming PN diodes below an insulator of the SOI wafer with impurities of n type or p type such that the PN diodes are aligned to sidewalls of the grid holes.

In some embodiments, the PN diodes may be electrically connected to the contacts on the front side of the SOI wafer through multilevel metal interconnect.

In some embodiments, the transparent material may include CsI.

In some embodiments, the method may further include coating sidewalls of the grid holes with a thin layer of oxide, a thin layer of nitride, a thin layer of silicon dioxide or metal, or a combination thereof.

In some embodiments, the thin layer of metal may include aluminum or chrome.

In some embodiments, the method may further include: covering the grid holes with an insulator; and coating sidewalls of the grid holes with an insulator stack with a dielectric constant such that light remains in the grid holes due to total internal reflection.

In some embodiments, the method may further include: scribing the silicon wafer in a square or rectangular shape by applying photoresist to form first and second tiles; placing and aligning a mask to the contacts on the front side of the silicon wafer with a precision of less than 1 micron; anisotropic or vertical plasma etching the silicon wafer with no undercut; plasma etching oxide and remaining layer of silicon of the silicon wafer with no undercut; placing the first tile next to the second tile with the first and second tiles butted against each other; and placing a straight edge against the first and second tiles so that two corners of butting edges of the first and second tiles are self-aligned.

In one aspect, an optical sensor may include a silicon wafer having a front side and a back side opposite the front side. The silicon wafer may include an array of pixels on the front side of the silicon wafer. Each of the pixels may include a photodiode and photo-sensing circuit. The silicon wafer may also include an array of grid holes on the back side of the silicon wafer. Each of the grid holes may be self-aligned with a respective photodiode of a respective pixel of the array of pixels. Each of the grid holes may be filled with a transparent material having a refractive index sufficient for total internal reflection of light in the respective grid hole. Incident light in the grid holes on the back side of the silicon wafer is converted into electron-hole pairs by the photodiodes of the pixels altering a charge across the photodiodes. A value of the altered charge may be proportional to an X-ray intensity sensed by the respective photo-sensing circuit of each pixel.

In some embodiments, the silicon wafer may include a SOI wafer.

In some embodiments, the grid holes on the back side of the SOI wafer may reach an insulator of the SOI wafer.

In some embodiments, PN diodes may be formed below an insulator of the SOI wafer with impurities of n type or p type. The PN diodes may be aligned to sidewalls of the grid holes.

In some embodiments, the PN diodes may be electrically connected to the contacts on the front side of the SOI wafer through multilevel metal interconnect.

In some embodiments, light sensed by the PN diodes and charge proportional to exposed radiation on the back side of the SOI wafer may appear at the contacts on the front side of the SOI wafer.

In some embodiments, sidewalls of the grid holes may be coated with a thin layer of oxide, a thin layer of nitride, a thin layer of silicon dioxide or metal, or a combination thereof.

In some embodiments, the thin layer of metal may include aluminum or chrome.

In some embodiments, the grid holes may be covered by an insulator. Sidewalls of the grid holes may be coated with an insulator stack with a dielectric constant such that light remains in the grid holes due to total internal reflection.

In some embodiments, the transparent material may include CsI.

In one aspect, a method of fabricating an optical sensor may include: providing a silicon wafer having a front side and a back side opposite the front side; forming an array of pixels on the front side of the silicon wafer, each of the pixels comprising a photodiode and photo-sensing circuit; forming an array of grid holes on the back side of the silicon wafer, each of the grid holes self-aligned with a respective photodiode of a respective pixel of the array of pixels; and filling each of the grid holes with a transparent material having a refractive index sufficient for total internal reflection of light in the respective grid hole. Incident light in the grid holes on the back side of the silicon wafer is converted into electron-hole pairs by the photodiodes of the pixels altering a charge across the photodiodes. A value of the altered charge may be proportional to an X-ray intensity sensed by the respective photo-sensing circuit of each pixel.

In some embodiments, the silicon wafer may include a SOI wafer.

In some embodiments, the grid holes on the back side of the SOI wafer may reach an insulator of the SOI wafer.

In some embodiments, the method may further include forming PN diodes below an insulator of the SOI wafer with impurities of n type or p type such that the PN diodes are aligned to sidewalls of the grid holes.

In some embodiments, the PN diodes may be electrically connected to the contacts on the front side of the SOI wafer through multilevel metal interconnect.

In some embodiments, the transparent material may include caesium iodide (CsI).

In some embodiments, the method may further include coating sidewalls of the grid holes with a thin layer of oxide, a thin layer of nitride, a thin layer of silicon dioxide or metal, or a combination thereof.

In some embodiments, the thin layer of metal may include aluminum or chrome.

In some embodiments, the method may further include: covering the grid holes with an insulator; and coating sidewalls of the grid holes with an insulator stack with a dielectric constant such that light remains in the grid holes due to total internal reflection.

In some embodiments, the method may further include: scribing the silicon wafer in a square or rectangular shape by applying photoresist to form first and second tiles; placing and aligning a mask to the contacts on the front side of the silicon wafer with a precision of less than 1 micron; anisotropic or vertical plasma etching the silicon wafer with no undercut; plasma etching oxide and remaining layer of silicon of the silicon wafer with no undercut; placing the first tile next to the second tile with the first and second tiles butted against each other; and placing a straight edge against the first and second tiles so that two corners of butting edges of the first and second tiles are self-aligned.

In one aspect, a direct X-ray sensor may include a direct X-ray sensing substrate. The substrate may include a photoconductor with a common electrode on a first side of the photoconductor and a pixel electrode on a second side of the photoconductor such that a voltage applied to the common electrode and the pixel electrode creates an electric field in the photoconductor. The substrate may also include a contact on a surface of a wafer of the substrate connected to the pixel electrode on the second side of the photoconductor. The direct X-ray sensor may also include a charge sensing structure. The charge sensing structure may include a capacitor with a first electrode, connected to a contact on a surface of the charge-sensing structure, and a second electrode connected to ground. The charge sensing structure may also include a sensing transistor. A contact on the X-ray sensing substrate may be aligned and bonded to the contact on the surface of the charge sensing structure. Beams of X-ray incident on the photoconductor is converted into electron-hole pairs drifting to the pixel electrode and altering a charge on a pre-charged electrode of the capacitor of the charge sensing structure. The transistor and supporting circuits in the charge sensing structure may convert the charge into a signal voltage.

In some embodiments, the photoconductor may include a single-crystal semiconductor.

In some embodiments, the photoconductor may include silicon, selenium, or CdTe.

In some embodiments, the pixel electrode may be implanted with n dopants.

In some embodiments, the pixel electrode may form a part of a PN junction of a PN diode.

In some embodiments, the PN diode may be reverse biased with a depletion layer near the pixel electrode.

In some embodiments, a Schottky diode may be formed in the photoconductor with the pixel electrode comprising metal.

In some embodiments, the metal may include platinum.

In some embodiments, the metal may be pre-charged. Beams of X-ray incident on the photoconductor may generate electrons to discharge the pixel electrode proportional to an intensity of X-ray.

In one aspect, a direct X-ray sensor may include a direct X-ray sensing substrate. The substrate may include: a photoconductor with a common electrode on a first side of the photoconductor; a PN junction on a second side of the photoconductor; and a contact on a surface of a wafer of the substrate connected to the PN junction on the second side of the photoconductor such that a voltage applied to the common electrode and a side of the PN junction close to the contact on the photoconductor creates an electric field in the photoconductor. The direct X-ray sensor may also include a charge sensing structure. The charge sensing structure may include a capacitor with a first electrode, connected to a contact on a surface of the charge sensing structure, and a second electrode connected to ground. The charge sensing structure may also include a sensing transistor. The contact on the X-ray sensing substrate may be aligned and bonded to the contact on the surface of charge sensing structure. Beams of X-ray incident on the photoconductor is converted into electron-hole pairs drifting to the PN junction and altering a charge on a pre-charged electrode of the capacitor of the charge sensing structure. The transistor and supporting circuits of the charge sensing structure may convert the charge into a signal voltage.

In some embodiments, the photoconductor may include a single-crystal semiconductor.

In some embodiments, the photoconductor may include silicon, selenium, or CdTe.

In some embodiments, the second side of the photoconductor may include a pixel electrode as a part of the PN junction and implanted with n dopants.

In some embodiments, the PN junction may be reverse biased with a depletion layer near the pixel electrode.

In some embodiments, a Schottky diode may be formed in the photoconductor with the second side of the photoconductor comprising metal.

In some embodiments, the metal may include platinum.

In some embodiments, the metal is pre-charged. Beams of X-ray incident on the photoconductor may generate electrons to discharge the pixel electrode proportional to an intensity of X-ray.

In one aspect, a direct X-ray sensor may include a direct X-ray sensing substrate. The substrate may include: a photoconductor with a common electrode on a first side of the photoconductor; a Schottky junction on a second side of the photoconductor; and a contact on a surface of a wafer of the substrate connected to the Schottky junction on the second side of the photoconductor such that a voltage applied to the common electrode and one side of the Schottky junction close to the contact on the photoconductor creates an electric field in the photoconductor. The direct X-ray sensor may also include a charge sensing structure. The charge sensing structure may include: a capacitor with a first electrode connected to a contact on a surface of the charge sensing structure; a sensing transistor; and a second electrode connected to ground. The contact on the X-ray sensing substrate may be aligned and bonded to the contact on the surface of the charge sensing structure. Beams of X-ray incident on the photoconductor are converted into electron-hole pairs drifting to the Schottky junction and altering a charge on a pre-charged electrode of the capacitor of the charge sensing structure. The transistor and supporting circuits of the charge sensing structure may convert the charge into a signal voltage.

In some embodiments, the photoconductor may include a single-crystal semiconductor.

In some embodiments, the photoconductor may include silicon, selenium, or CdTe.

In some embodiments, the second side of the photoconductor may include metal.

In some embodiments, the metal may include platinum.

In some embodiments, the metal may be pre-charged. Beams of X-ray incident on the photoconductor may generate electrons to discharge the pixel electrode proportional to an intensity of X-ray.

In one aspect, a method of fabricating a photo-die of an X-ray sensor may include: forming a silicon layer on a silicon-on-insulator (SOI) substrate by epitaxial growth and slightly doping the silicon layer with dopants of a first electric polarity; forming an oxide layer on the silicon layer; forming a first mask for a plurality first wells; forming the plurality of first wells in the SOI substrate; heavily doping the first wells with dopants of the first electric polarity; performing annealing of the first wells; forming a second mask for a plurality of second wells; forming the plurality of second wells in the SOI substrate; heavily doping the second wells with dopants of a second electric polarity; performing annealing of the second wells; forming a plurality of contact holes; forming tungsten silicide in the contact holes; forming a first metal layer; forming a first dielectric layer; forming a second metal layer; forming a second dielectric layer; forming grid holes; performing grid hole plasma etch; forming an oxide layer on sidewalls of the grid holes; filing the grid holes with CsI; and melting the CsI in the grid holes.

In some embodiments, dopants of the first electric polarity may include p dopants and dopants of the second electric polarity may include n dopants.

In some embodiments, at least one of the first metal layer or the second metal layer may include tungsten.

In some embodiments, forming tungsten silicide in the contact holes may include forming tungsten silicide in the contact holes at 1000° C.

In some embodiments, performing annealing may include performing annealing at 680° C.

In some embodiments, forming an oxide layer on sidewalls of the grid holes may include forming the oxide layer on sidewalls of the grid holes by chemical vapor deposition (CVD).

In some embodiments, the method may further include sealing the grid holes with copper (Cu) pillars.

Additional Notes

Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

As used to describe such embodiments, terms such as "above", "below", "upper", "lower", "top", "bottom", "horizontal", "vertical" and "side", for example, describe positions relative to an arbitrary axis of an element. In particular, the terms "above" and "below" refer to positions along an axis, where "above" refers to one side of an element while "below" refers to an opposite side of an element. Relative to terms "above" and "below", the term "side" refers to a side of an element that is displaced from an axis, such as the periphery of the element, for example. Further, it is understood that such terms do not necessarily refer to a direction defined by gravity or any other particular orientation reference. Instead, such terms are merely used to identify one portion versus another portion. Accordingly, "upper" and "lower" may be equivalently interchanged with "top" and "bottom", "first" and "second", "right" and "left", and so on. The term "horizontal" may refer to an orientation perpendicular to an axis while the term "vertical" may refer to an orientation parallel to the same axis, and vice versa.

The terms "and", "and/or" and "or" as used herein may include a variety of meanings that are expected to depend at least in part upon the context in which such terms are used. Typically, the term "or" as well as "and/or", if used to associate a list, such A, B or C, is intended to mean A, B and C, used in the inclusive sense, as well as A, B or C, used in the exclusive sense. In addition, the term "one or more" as used herein may be used to describe any feature, structure, or characteristic in the singular or plural sense to describe some combination of features, structures or characteristics. Though, it should be noted that this is merely an illustrative example and the claimed subject matter of the present disclosure is not limited to this example.

Although the present disclosure is described in terms of certain preferred embodiments, other embodiments will be apparent to those of ordinary skill in the art, given the benefit of this disclosure, including embodiments that do not provide all of the benefits and features set forth herein, which are also within the scope of this disclosure. It is to be understood that other embodiments may be utilized, without departing from the scope of the present disclosure.

The invention claimed is:

1. An indirect X-ray sensor, comprising:
   a silicon wafer having a front side and a back side opposite the front side, the silicon wafer having an array of photodiodes thereon with each of the photodiodes having a contact on the front side of the silicon wafer and self-aligned with a respective grid hole of an array of grid holes that are on the back side of the silicon wafer, each of the grid holes filled with a scintillator configured to convert beams of X-ray into light; and
   one or more silicon dies with an array of photo-sensing circuits, each of the photo-sensing circuits having a contact at a top surface of the one or more silicon dies,
   wherein the contact on each of the photodiodes is aligned and bonded to the contact of a respective photo-sensing circuit of the array of photo-sensing circuits of the one or more silicon dies,
   wherein light converted from beams of X-ray by the scintillators within the grid holes is converted into electron-hole pairs by the photodiodes altering a voltage across the photodiodes, and
   wherein the voltage is sensed by the photo-sensing circuits through the contacts on the photodiodes and the contacts on the photo-sensing circuits.

2. The indirect X-ray sensor of claim 1, wherein the silicon wafer comprises a silicon-on-insulator (SOI) wafer.

3. The indirect X-ray sensor of claim 2, wherein the grid holes on the back side of the SOI wafer reach an insulator of the SOI wafer.

4. The indirect X-ray sensor of claim 2, wherein PN diodes are formed below an insulator of the SOI wafer with impurities of n type or p type, and wherein the PN diodes are aligned to sidewalls of the grid holes.

5. The indirect X-ray sensor of claim 4, wherein the PN diodes are electrically connected to the contacts on the front side of the SOI wafer through multilevel metal interconnect.

6. The indirect X-ray sensor of claim 4, wherein light sensed by the PN diodes and charge proportional to exposed radiation on the back side of the SOI wafer appear at the contacts on the front side of the SOI wafer.

7. The indirect X-ray sensor of claim 1, wherein sidewalls of the grid holes are coated with a thin layer of oxide, a thin layer of nitride, a thin layer of silicon dioxide or metal, or a combination thereof.

8. The indirect X-ray sensor of claim 7, wherein the thin layer of metal comprises aluminum or chrome.

9. The indirect X-ray sensor of claim 1, wherein the grid holes are covered by an insulator, and wherein sidewalls of the grid holes are coated with an insulator stack with a dielectric constant such that light remains in the grid holes due to total internal reflection.

10. The indirect X-ray sensor of claim 1, wherein the contacts of the array of photodiodes on the silicon wafer have a first pitch, wherein the contacts of the array of photo-sensing circuits on the one or more silicon dies have a second pitch smaller than the first pitch, and wherein the contacts of the array of photodiodes on the silicon wafer and the contacts of the array of photo-sensing circuits on the one or more silicon dies are bonded together face to face with the first pitch reduced using multilevel metal interconnects.

* * * * *